(12) United States Patent
Hong et al.

(10) Patent No.: US 11,569,232 B2
(45) Date of Patent: Jan. 31, 2023

(54) SEMICONDUCTOR DEVICE INCLUDING SELF-ALIGNED GATE STRUCTURE AND METHOD OF MANUFACTURING THE SAME

(71) Applicant: SAMSUNG ELECTRONICS CO., LTD., Suwon-si (KR)

(72) Inventors: Byounghak Hong, Albany, NY (US); Seunghyun Song, Albany, NY (US); Hwichan Jun, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 17/152,388

(22) Filed: Jan. 19, 2021

(65) Prior Publication Data

US 2022/0157815 A1 May 19, 2022

Related U.S. Application Data

(60) Provisional application No. 63/114,059, filed on Nov. 16, 2020.

(51) Int. Cl.
| | |
|---|---|
| *H01L 27/092* | (2006.01) |
| *H01L 29/06* | (2006.01) |
| *H01L 29/423* | (2006.01) |
| *H01L 29/786* | (2006.01) |
| *H01L 21/02* | (2006.01) |
| *H01L 21/28* | (2006.01) |

(Continued)

(52) U.S. Cl.
CPC .... *H01L 27/0922* (2013.01); *H01L 21/02603* (2013.01); *H01L 21/28123* (2013.01); *H01L 21/823807* (2013.01); *H01L 21/823828* (2013.01); *H01L 29/0673* (2013.01); *H01L 29/42392* (2013.01); *H01L 29/66742* (2013.01); *H01L 29/78696* (2013.01)

(58) Field of Classification Search
CPC ........... H01L 27/0922; H01L 21/02603; H01L 21/28123; H01L 21/823807; H01L 21/823828; H01L 29/0673; H01L 29/42392; H01L 29/66742; H01L 29/78696
USPC ....................................... 257/351
See application file for complete search history.

(56) References Cited

U.S. PATENT DOCUMENTS

| | | | |
|---|---|---|---|
| 9,356,027 B1 * | 5/2016 | Cheng | ............ H01L 21/823821 |
| 10,361,308 B2 | 7/2019 | Cheng et al. | |
| 10,505,016 B2 | 12/2019 | Greene et al. | |

(Continued)

*Primary Examiner* — Tong-Ho Kim
(74) *Attorney, Agent, or Firm* — Sughrue Mion, PLLC

(57) ABSTRACT

A method of manufacturing a semiconductor device having a self-aligned gate structure includes: providing at least one channel structure above at least one substrate; depositing at least one gate masking layer on the at least one channel structure so that the at least one gate masking layer is formed on top and side surfaces of the at least one channel structure and spread outward above the at least one substrate to form outer-extended portions of the at least one gate masking layer, before a gate-cut process is performed, wherein the at least one gate masking layer is self-aligned with respect to the at least one channel structure by the depositing; and removing the outer-extended portions of the at least one gate masking layer so that the at least one gate masking layer at both sides of the at least one channel structure has a same width.

20 Claims, 16 Drawing Sheets

(51) Int. Cl.
    *H01L 21/8238*     (2006.01)
    *H01L 29/66*     (2006.01)

(56) References Cited

U.S. PATENT DOCUMENTS

| | | |
|---|---|---|
| 10,629,701 B1 | 4/2020 | Xie et al. |
| 2005/0250285 A1* | 11/2005 | Yoon .................. H01L 29/7851 |
| | | 438/157 |
| 2019/0139830 A1* | 5/2019 | Xie .................. H01L 21/31116 |
| 2019/0305111 A1 | 10/2019 | Subramanian et al. |
| 2019/0393214 A1* | 12/2019 | Li ........................ H01L 23/535 |
| 2020/0035674 A1 | 1/2020 | Lu et al. |
| 2020/0098750 A1 | 3/2020 | Lin et al. |

\* cited by examiner

SEMICONDUCTOR DEVICE INCLUDING SELF-ALIGNED GATE STRUCTURE AND METHOD OF MANUFACTURING THE SAME

CROSS-REFERENCE TO THE RELATED APPLICATION

This application is based on and claims priority from U.S. Provisional Application No. 63/114,059 filed Nov. 16, 2020 in the U.S. Patent and Trademark Office, the disclosure of which is incorporated herein in its entirety by reference.

BACKGROUND

1. Field

Apparatuses and methods consistent with example embodiments of the disclosure relate to a gate structure of a semiconductor device, and more particularly to, a self-aligned gate structure of a gate all around transistor such as a fin field-effect transistor (finFET) or a multi-bridge channel field effect transistor (MBCFET).

2. Description of the Related Art

In a related-art method of manufacturing transistors, a photolithography masking process is used to define a gate structure followed by a gate cut process in an array of transistor structures such as a finFET or an MBCFET, which is also referred to as a nanosheet.

However, when a hardmask for the photolithography masking is misaligned, a gate structure having an insufficient size may be defined while a sufficient area for the gate cut process is required. This misalignment of photolithography masking may lead to inconsistent gate structure dimensions between transistors in the array of transistor structures, which subsequently causes unstable current control as well as a short circuit and a connection failure between transistors, thereby reducing yields and lowering productivity.

For example, the related-art gate cut process often generates a transistor structure as shown in FIG. 1.

Referring to FIG. 1, a finFET device 100 includes a set of fin structures 110 as channel structures on a substrate 105 and a shallow trench isolation (STI) layer 106. The fin structures 110 are protruded or raised from the substrate 105, and enclosed by a gate structure 115 to build the semiconductor device 100 as a finFET device. The gate structure 115 controls current flow through the fin structures 110 in a D1 direction, which is a channel length direction, between source/drain regions (not shown) epitaxially grown from the fin structures 110, when a voltage is applied to the gate structure 115. The semiconductor device 100 further includes a gate-cut masking structure 116 at both sides of the gate structure 115 to separate the gate structure 115 from gate structures of adjacent cells. Here, the D1 direction is perpendicular to a D2 direction, which is a channel width direction, and a D3 direction which is a channel height direction.

Here, it is noted that the gate structure 115 has different widths W1 and W2 at both sides of the set of the fin structures 110 generally caused by misalignment occurring during the aforementioned photolithography masking followed by a gate-cut process. When this misalignment occurs in manufacturing of a complementary metal oxide semiconductor (CMOS) device, the performance of the CMOS device may be deteriorated because of different dimensions between a p-type MOSFET and an n-type MOSFET constituting the CMOS device. Thus, it is required to address the photolithography masking process in manufacturing a finFET device.

Although the above problem of the photolithography masking process is mentioned with regard to manufacturing a single stack finFET device, the same problem may adversely affect in manufacturing a single stack MBCFET device, a multi-stack finFET device, and a multi-stack MBCFET device.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

The disclosure provides a semiconductor device having a self-aligned gate structure and a method of manufacturing the same.

According to an embodiment, there is provided a semiconductor device which may include: at least one substrate; at least one channel structure formed on the at least one substrate; and at least one gate structure surrounding at least top and side surfaces of the at least one channel structure, wherein the at least one gate structure has a self-aligned form with respect to the at least one channel structure such that a left horizontal distance between a left-most side surface of the at least one channel structure and a left side surface of the at least one gate structure is equal to a right horizontal distance between a right-most side surface of the at least one channel structure and a right side surface of the at least one gate structure.

According to an embodiment, there is provided semiconductor device array including a plurality of semiconductor devices, wherein each of the semiconductor devices may include: at least one substrate; at least one channel structure formed on the at least one substrate; and at least one gate structure surrounding at least top and side surfaces of the at least one channel structure, wherein the at least one gate structure is a replacement of at least one gate masking layer which is self-aligned with respect to the at least one channel structure to have a same width at both sides of the at least one channel structure in a channel width direction, and wherein the at least one gate masking layer is self-aligned with respect to the at least one channel structure without using photolithography masking which defines the at least one gate structure before a gate-cut process is applied to the semiconductor device array.

According to an embodiment, there is provided a method of manufacturing a semiconductor device having a self-aligned gate structure. The method may include: providing at least one channel structure above at least one substrate; depositing at least one gate masking layer on the at least one channel structure so that the at least one gate masking layer is formed on top and side surfaces of the at least one channel structure and spread outward above the at least one substrate to form outer-extended portions of the at least one gate masking layer, before a gate-cut process is performed, wherein the at least one gate masking layer is self-aligned with respect to the at least one channel structure by the depositing; and removing the outer-extended portions of the at least one gate masking layer so that the at least one gate masking layer at both sides of the at least one channel structure has a same width.

The above embodiments of the disclosure may enable manufacturing of an array of semiconductor devices which have gate structures with a consistent dimension overcoming misalignment deficiencies that may occur during photolithography masking and gate-cutting steps in the manufacturing process.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
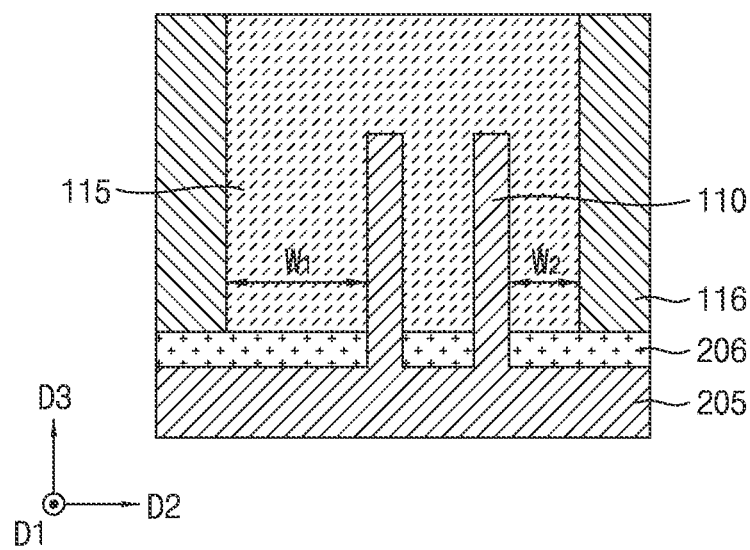
FIG. 1 illustrates a simplified cross-sectional view of a related-art transistor structure before a gate cutting operation is performed on an array of a plurality of transistor structures.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. In addition, terms such as a "row" and a "column" of an array, in which a plurality of semiconductor structures are arranged, may be interpreted as a "column" and a "row" when the array is rotated 90 degrees.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, although in an embodiment of manufacturing an inventive apparatus or structure, a step or operation is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including a finFET and an MBCFET may or may not be described in detail herein. However, even if a certain element is described or illustrated in a semiconductor device in this disclosure, the element may not be included in a claimed semiconductor device unless the element is recited as being included in the claimed semiconductor device. Also, when a particular method for deposition or etching used in manufacturing a semiconductor device is or is not mentioned herein, it will be understood that a conventional method for such deposition or etching may be applied in corresponding steps of manufacturing the semiconductor device FIGS. 2A through 2E illustrate simplified cross-sectional views of a finFET device at a plurality of steps until the finFET device is defined by a gate-cut masking structure, according to embodiments.

Figure 2A:
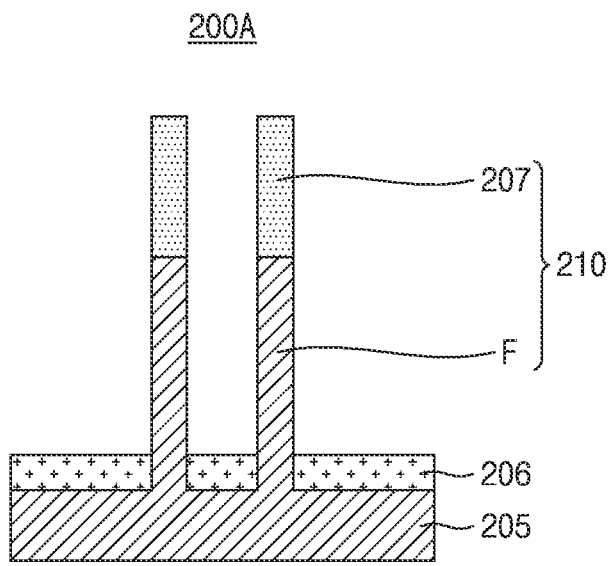
FIGS. 2A through 2E illustrate simplified cross-sectional views of a finFET device at a plurality of steps until the finFET device is defined by a gate-cut masking structure, according to embodiments.

FIG. 2A shows that a finFET device having channel structures is formed on a substrate according to an embodiment.

Referring to FIG. 2A, a finFET device 200A includes a substrate (wafer) 205, an STI layer 206 formed on the substrate 205, and a set of fin structures 210 formed on the substrate 205 as channel structures of the finFET device 200A. The substrate 205 may be formed of silicon (Si) or other semiconductor materials, such as germanium (Ge), or may be a silicon-on-insulator (SOI) substrate. The STI layer 206 may be provided to isolate the finFET device 200A formed of the channel structures 210 from an adjacent semiconductor device, and may be formed of silicon oxide ($SiO_x$) not being limited thereto.

The set of the fin structures 210 takes the same form of the fin structures 110 shown in FIG. 1, but is different from the fin structures 110 in that a fin mask layer 207 is formed on a fin F of each of the fin structures 210, according to an embodiment. The fin mask layer 207 remains on the fin F after a related art fin etching process in which the fin F is patterned from the substrate 205 using photolithography masking and etching using the fin mask layer 207. The fin mask layer 207 may be formed of silicon nitride ($Si_xN_y$), not being limited thereto. Each of the fin structures 210 may have a rectangular shape with a top surface parallel to a top surface of the substrate 205 and side surfaces perpendicular to the top surface of the substrate 205.

In FIG. 2A, the set of the fin structures 210 includes two fin structures. However, the inventive concept is not limited thereto, and just a single fin structure or more than two fin structures may be formed on the substrate 205, according to embodiments.

Figure 2B:
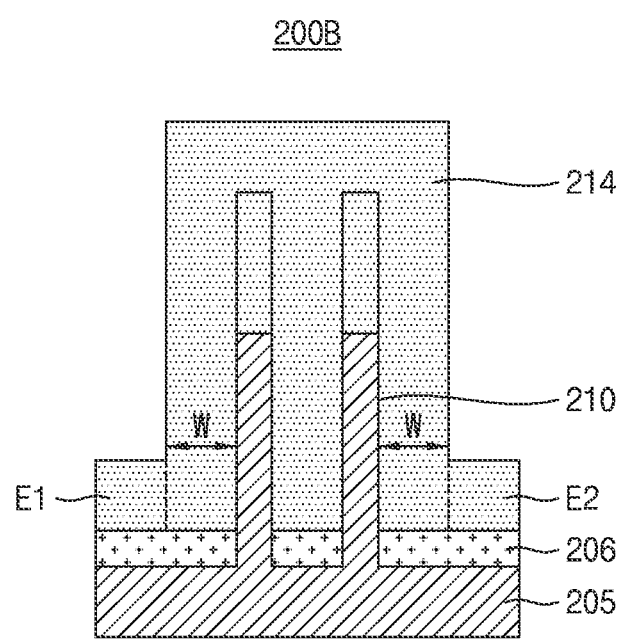

FIG. 2B shows a finFET device obtained after a next manufacturing step is performed on the finFET device of FIG. 2A.

According to an embodiment, a gate masking layer 214 is formed on each of the fin structures 210 shown in FIG. 2A to build a finFET device 200B. The gate masking layer 114 may also be referred to as a dummy gate structure or a sacrificial gate layer.

In a related-art method of manufacturing a semiconductor device such as a finFET device, the fin mask layers 207 shown in FIG. 2A are removed from the fin structures 210, a gate structure is formed to cover the fins F remaining after the removal of the fin mask layers 207, and photolithography masking and etching steps are performed to obtain a space at both sides of the gate structure to deposit a gate-cut masking structure. However, an embodiment in this disclosure, unlike the related-art method, provides that a gate masking layer 214 is deposited on the fin structures 210 with the fin mask layers 207 in a self-aligning manner to build the finFET device 200B. The gate masking layer 214 may be formed of the same $Si_xN_y$ forming the fin mask layer 207 or a material having a similar etch selectivity as the material forming the fin mask layer 207. According to an embodiment, the gate masking layer 214 may be formed of polysilicon.

According to an embodiment, the gate masking layer 214 is self-aligned with respect to the fin structures 210 using the fin mask layer 207. For this self-alignment, the gate masking layer 217 is deposited from top surfaces of the fin structures 210 to spread along side surfaces of the fin structures 210 to fill in a space between the fin structures 210, and extend above the substrate 205 at both sides of the set of the fin structures 210 in outside directions. Here, the gate masking layer 214 can be self-aligned due to not only the fin mask layer 207 but a dimension of the fin structures 210 in which a distance between the fin structures 210 is short while a distance between the fin structures 210 and fin structures in adjacent cells is long. Because of the short distance between the fin structures 210, the space between the fin structures 210 can be filled out with the gate masking layer 214. Further, because of the long distance between the fin structures 210 and the fin structures of the adjacent cells, the gate masking layer 214 can spread to extend above the substrate 205 at both sides of the set of the fin structures 210 in the outside directions. Thus, the self-aligned gate masking layer 214 includes outer-extended portions E1 and E2 which are extended from the side surfaces of the gate masking layer 214 and formed only above the substrate 205.

The gate masking layer 214 may be conformally deposited along the outer surfaces, that is, the top and side surfaces, of the fin structures 210 through chemical vapor deposition (CVD), plasma enhanced chemical vapor deposition (PECVD), or atomic layer deposition (ALD), not being limited thereto. Meanwhile, as the gate masking layer 214 is self-aligned with respect to the fin structures 210, the gate masking layer 214 has a same width W at both sides of the set of fin structure 210 which is measured from an outer side surface of the left-most or right-most fin structure of the fin structures 210 to a left or right side of the gate masking layer 214.

Figure 2C:
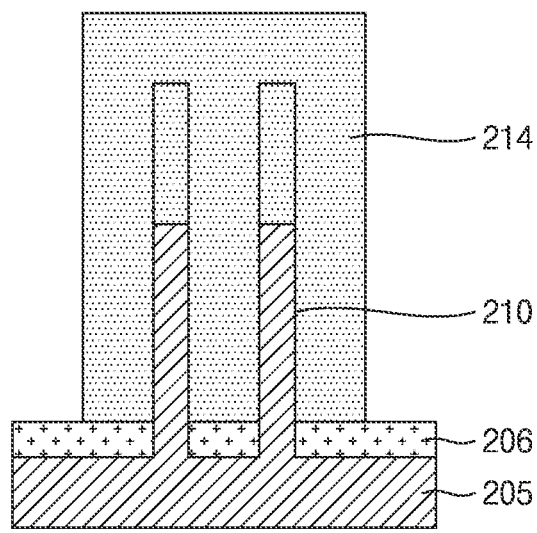

FIG. 2C shows that a finFET device obtained after a next manufacturing step is performed on the finFET device of FIG. 2B.

Referring to FIG. 2C, the gate masking layer 214 shown in FIG. 2B is etched at the outer-extended portions E1 and E2 by performing at least one of reactive ion etching (RIE) and anisotropic etching to obtain a finFET device 200C, according to an embodiment. After this etching, the gate masking layer 214 may have the same horizontal width W at both sides of the set of the fin structures 210 along the entire vertical length of the fin structures 210 above the substrate 205, according to an embodiment.

Thus, unlike the finFET device 100 shown in FIG. 1, the gate masking layer 214 and a gate structure to replace the gate masking layer 214 in a later stop of manufacturing a finFET device can have a same consistent dimension as an adjacent gate masking layer and a gate structure to replace the adjacent gate masking layer, respectively, in an adjacent cell. Accordingly, the present method of manufacturing a finFET device is able to prevent misalignment that may occur between adjacent transistor structures obtained from a same array of transistor structures in the related-art finFET device manufacturing method.

Figure 2D:
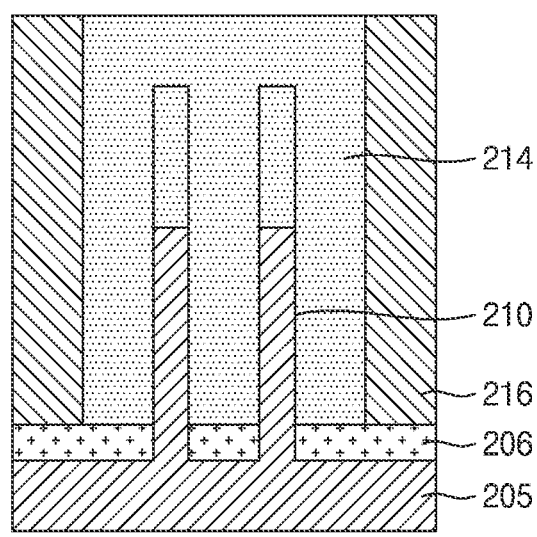

FIG. 2D shows that a finFET device obtained after a next manufacturing step is performed on the finFET device of FIG. 2C.

In FIG. 2D, a finFET device 200D is formed by depositing a gate-cut masking structure 216 to isolate the gate masking layer 214 from an adjacent gate masking layer. The gate-cut masking structure 216 may be formed of a low-k dielectric material such as silicon oxide ($SiO_x$).

Figure 2E:
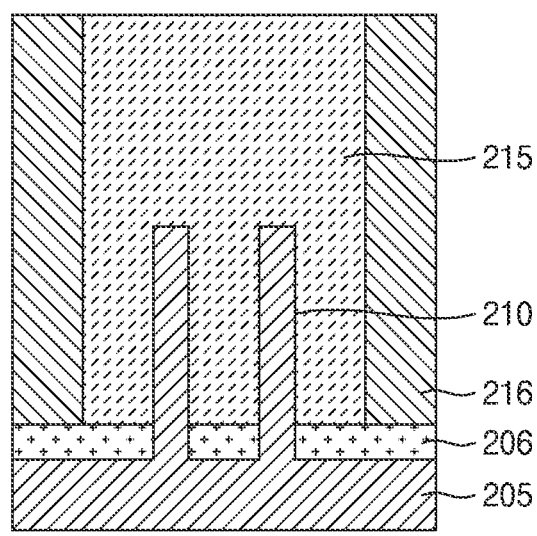

FIG. 2E shows that a finFET device obtained after a next manufacturing step is performed on the finFET device of FIG. 2D, according to an embodiment.

In FIG. 2E, a finFET device 200E is obtained by removing the gate masking layer 214 by, for example, wet etching, from the finFET device 200D, and filling out a space, void by the removal of the gate masking layer 214, with a gate structure 215. The gate structure 215 may be filled in the space such that a hafnium (Hf) based high-k dielectric layer and a work function metal layer of Titanium (Ti), Tantalum (Ta) or their compound are first deposited, and then, a conductor metal such as tungsten (W) or aluminum (Al) is deposited to form the gate structure 215. The deposition process used herein may be at least one of CVD, PECVD and ALD.

As the gate masking layer 214 has a same horizontal width at both sides of the set of the fin structures 210, the gate structure 215 replacing the gate masking layer 214 also has a same horizontal width at both sides of the set of the fin structures 210, and this width may be consistent along the entire vertical length of the fin structures 210, according to an embodiment. It is understood here that since the gate structure 215 replacing the gate masking layer 214 is defined by the gate masking layer 214, the gate structure 215 is also self-aligned with respect to the set of fin structures 210.

The above self-aligned gate structure may also be formed for a multiple sets of fin structures sharing a same gate structure as described below, according to embodiments.

FIGS. 3A through 3E illustrate simplified cross-sectional views of another finFET structure at a plurality of steps until finished as another finFET device defined by a gate-cut masking structure, according to embodiments.

Figure 3A:
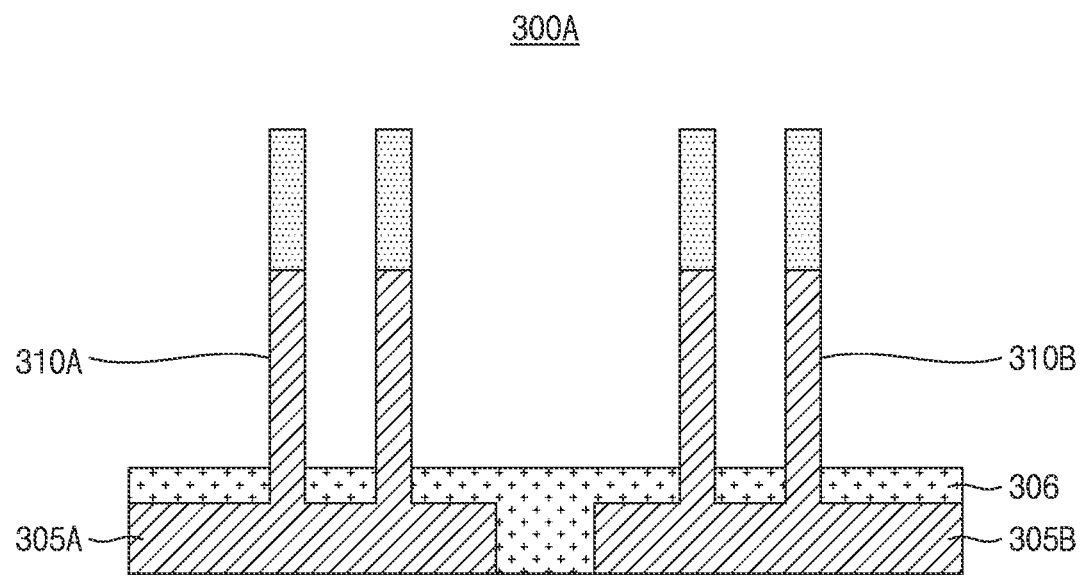
FIGS. 3A through 3F illustrate simplified cross-sectional views of another finFET structure at a plurality of steps until finished as another finFET device defined by a gate-cut masking structure, according to embodiments.

FIG. 3A shows that a finFET device having two sets of channel structures formed on a substrate according to an embodiment.

Referring to FIG. 3A, a finFET device 300A includes $1^{st}$ and $2^{nd}$ substrates 305A and 305B, an STI layer 306 formed thereon, and two set of channel structures, that is, $1^{st}$ and $2^{nd}$ sets of fin structures 310A and 310B formed side by side above the $1^{st}$ and $2^{nd}$ substrates 305A and 305B, respectively. Each of the $1^{st}$ and $2^{nd}$ substrates 305A and 305B, the STI layer 306, and each of the $1^{st}$ and $2^{nd}$ sets of the fin structures 310 may have the same structure and shape with the same materials as the substrate 205, the STI layer 206 and each of the fin structures 210 shown in FIGS. 2A to 2E. Thus, duplicate descriptions are omitted herein.

In FIG. 3A, the finFET device 300A includes two sets of fin structures, and each of the two sets of fin structures consists of two fin structures. However, the inventive concept is not limited thereto, and more than two sets of fin structures may form the finFET device 300A or each of the two sets of fin structures may include just a single fin structure or more than two fin structures, according to embodiments.

Figure 3B:
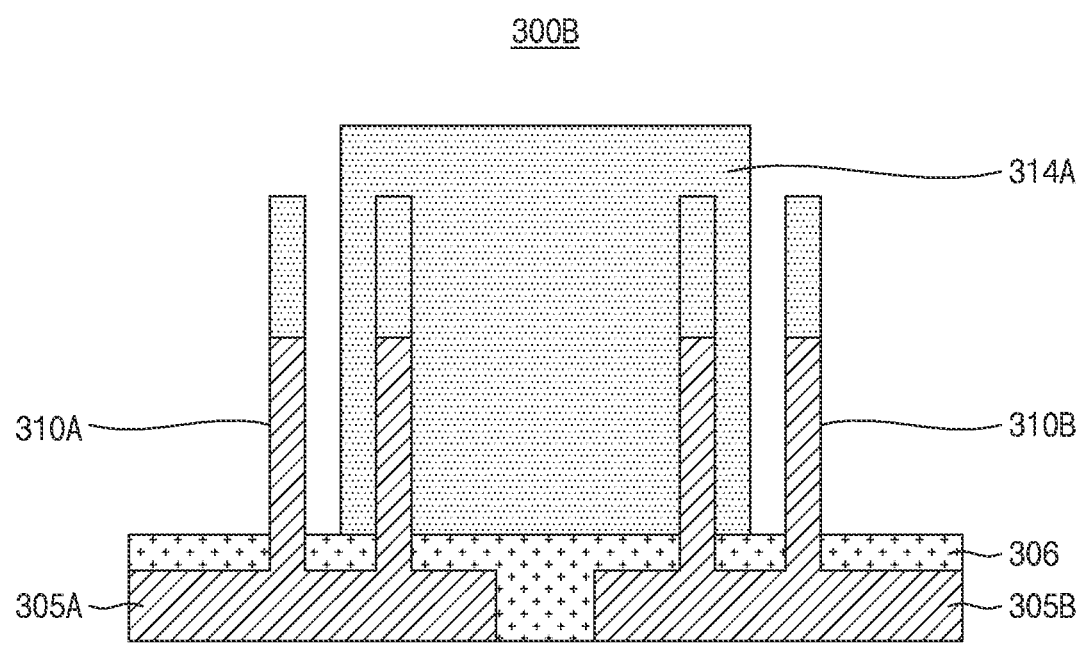

FIG. 3B shows a finFET device obtained after a next manufacturing step is performed on the finFET device of FIG. 3A, according to an embodiment.

In this step, the $1^{st}$ and $2^{nd}$ sets of fin structures 310A and 320A are bridged or connected by depositing a $1^{st}$ gate masking layer 314A on a right-most fin structure of the $1^{st}$ sets of the fin structures 310A and a left-most fin structure of the $2^{nd}$ set of the fin structures 310B so that the $1^{st}$ gate masking layer 314A covers top and side surfaces of these right-most and left-most fin structures of the $1^{st}$ and $2^{nd}$ sets of the fin structures 310A and 310B, respectively.

Here, the $1^{st}$ gate masking layer 314 may be formed of the same material forming the gate masking layer 214 shown in FIGS. 2B to 2D, and may be deposited in the same manner as the gate masking layer 214 through at least one of CVD, PECVD and ALD, not being limited thereto.

Figure 3C:
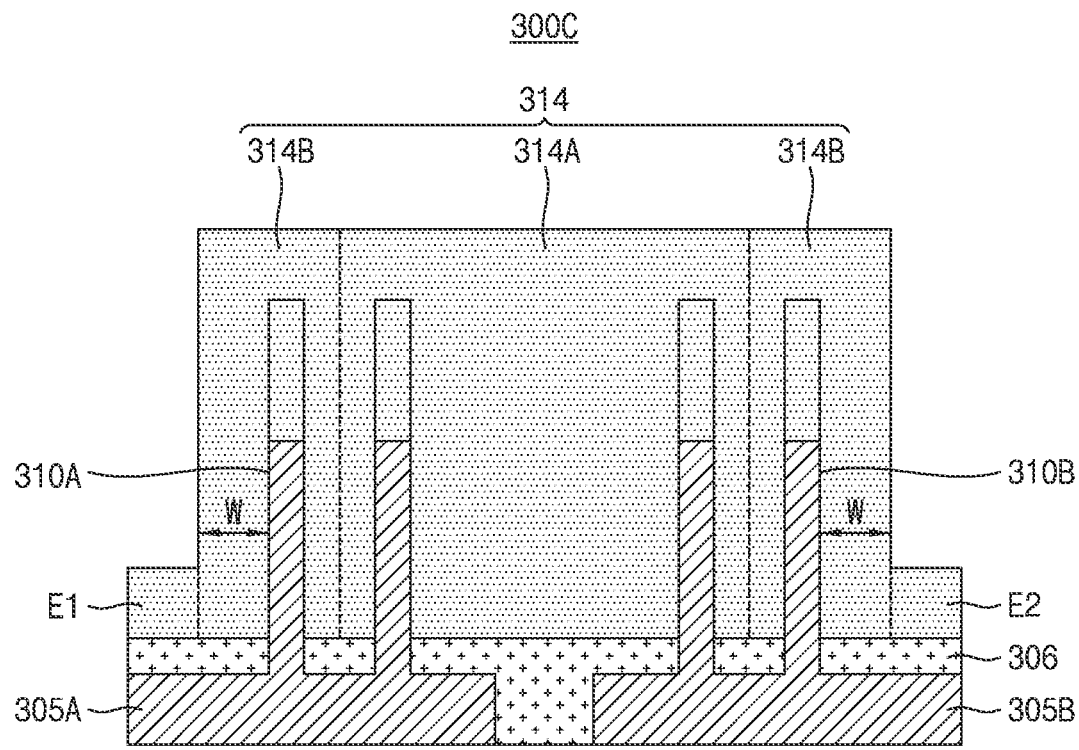

FIG. 3C shows a finFET device obtained after a next manufacturing step is performed on the finFET device of FIG. 3B, according to an embodiment.

After the $1^{st}$ gate masking layer 314A is deposited as shown in FIG. 3B, a $2^{nd}$ gate masking layer 314B is deposited on the $1^{st}$ and $2^{nd}$ sets of the fin structures and the $1^{st}$ gate masking layer in a self-aligning manner. Here, the $2^{nd}$ gate masking layer 314B is self-aligned with respect to a left-most fin structure of the $1^{st}$ set of the fin structures 310A and a right-most fin structure of the $2^{nd}$ set of the fin structures 310B. Thus, the $2^{nd}$ gate masking layer 314B may be able to fill in a space between fin structures of each of the $1^{st}$ and $2^{nd}$ sets of the fin structures 310A and 310B entirely, and the $2^{nd}$ gate masking layer may also be extended in the outside directions above the $1^{st}$ and $2^{nd}$ substrates. By this self-aligning deposition of the $2^{nd}$ gate masking layer 314B, a combined gate masking layer 314, which is a combination of the $1^{st}$ and $2^{nd}$ gate masking layers 314A and 314B includes outer-extended portions E1 and E2 which are extended from the side surfaces of the combined gate masking layer 314 and formed only above the substrate 305 and the STI layer 306, respectively.

Here, the $1^{st}$ and $2^{nd}$ gate masking layers 314A and 314B may be formed of the same material forming the $1^{st}$ gate masking layer 314A, and the deposition of the $2^{nd}$ gate masking layer 314B may also be performed through at least one of CVD, PECVD and ALD, not being limited thereto. Meanwhile, as the $2^{nd}$ gate masking layer 314B is self-aligned as described above, the combined gate masking layer 314 has a same width W at outer sides of the $1^{st}$ and $2^{nd}$ sets of the fin structures 310A and 210 which is measured from an outer side surface of the left-most fin structure of the $1^{st}$ set of the fin structures 310A or an outer side surface of the right-most fin structure of the $2^{nd}$ set of the fin structures 310B to a left or right side of the combined gate masking layer 314.

Figure 3D:
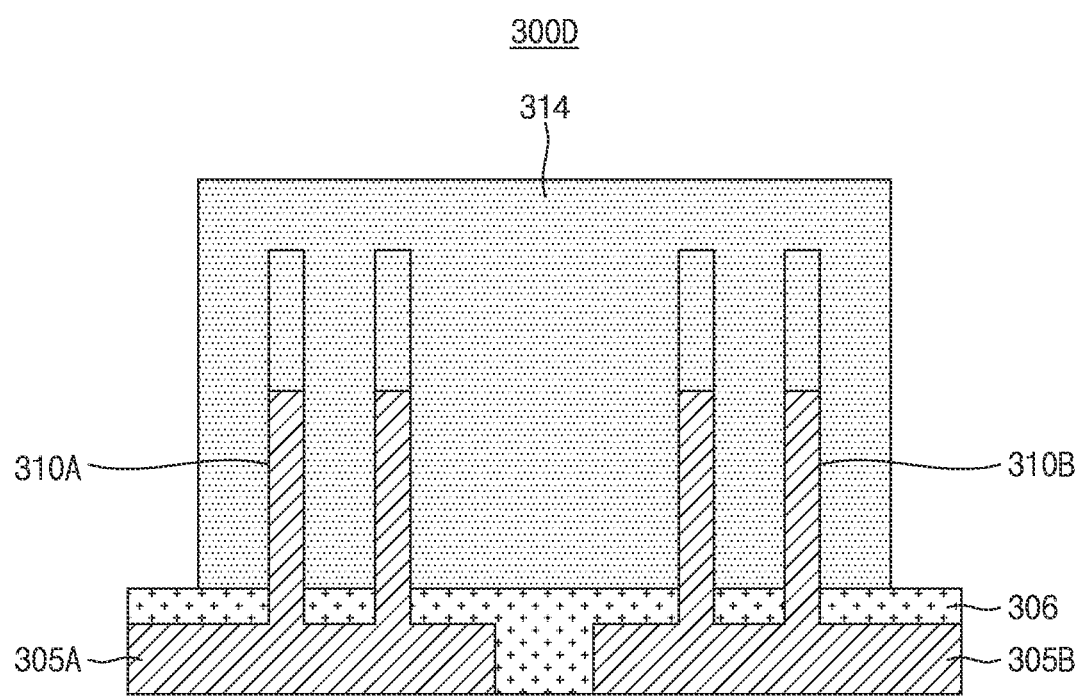

FIG. 3D shows a finFET device obtained after a next manufacturing step is performed on the finFET device of FIG. 3C, according to an embodiment.

Like in the step shown in FIG. 2C, the combined gate masking layer 314 shown in FIG. 3C is etched at the outer-extended portions E1 and E2 by at least one of RIE and anisotropic etching in a finFET device 300D, according to an embodiment. After this etching, the combined gate masking layer 314 may have the same horizontal width W at both sides thereof along the entire vertical length of the left-most fin structure of the $1^{st}$ sets of the fin structures 310A and the entire vertical length of the right-most fin structures of the $2^{nd}$ sets of the fin structures 310B, according to an embodiment.

Thus, a gate structure to replace the combined gate masking layer 314 in a later stop of manufacturing a finFET device can provide a same consistent dimension to the finFET device without misalignment. For example, a CMOS device built from the $1^{st}$ and $2^{nd}$ sets of the fin structures 310A and 310B by sharing a gate structure replacing the combined gate masking layer 314 may have an improved, balanced performance in terms of controlling current flow by the gate structure.

Figure 3E:
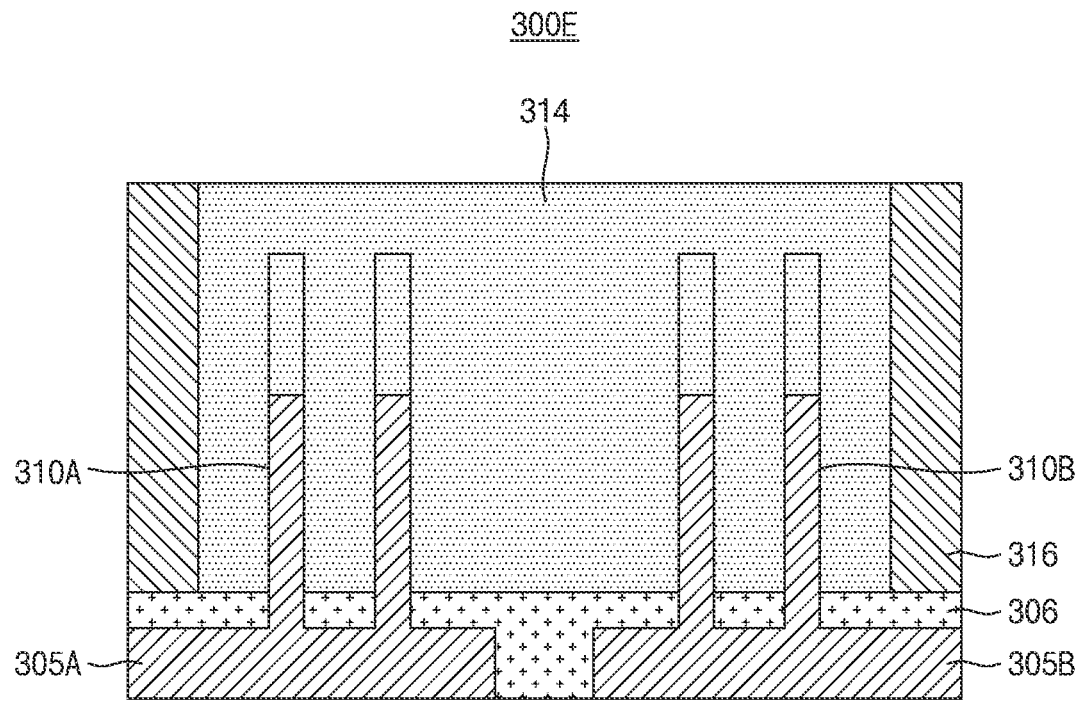

FIG. 3E shows that a finFET device obtained after a next manufacturing step is performed on the finFET device of FIG. 3C, according to an embodiment.

In FIG. 3E, a finFET device 300E is formed by depositing a gate-cut masking structure 316 to isolate the combined gate masking layer 314 from an adjacent gate masking layer. The gate-cut masking structure 316 may be formed of the same material forming the gate-cut masking structure 216 in FIG. 2D.

Figure 3F:
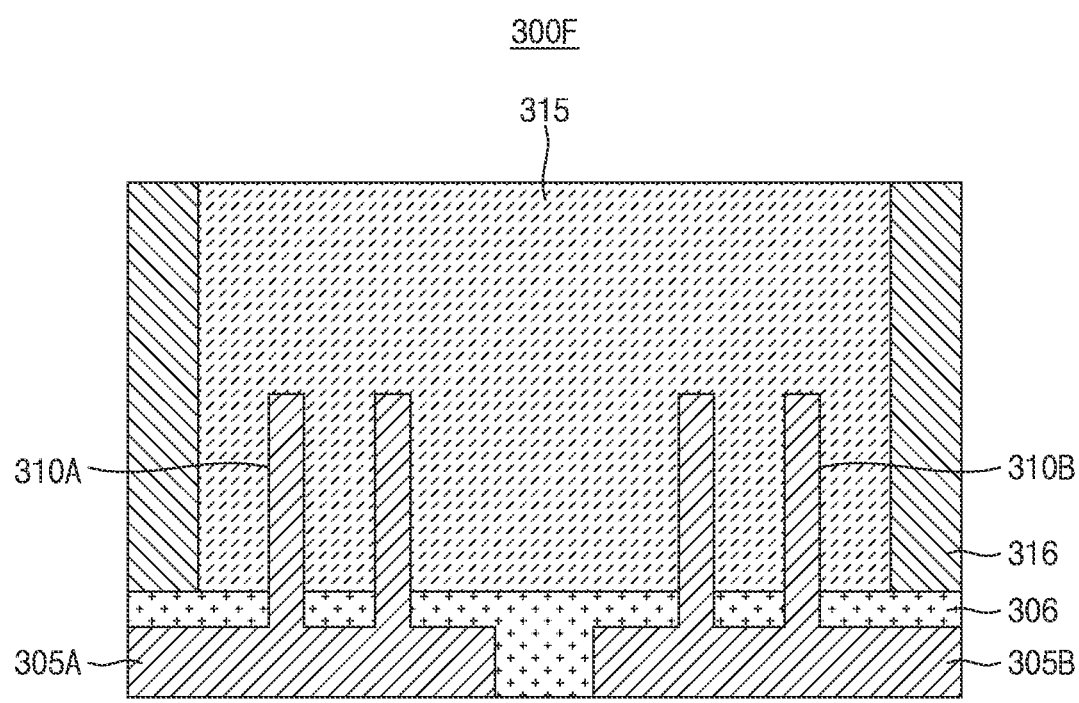

FIG. 3F shows that a finFET device obtained after a next manufacturing step is performed on the finFET device of FIG. 3E, according to an embodiment.

In FIG. 3F, a finFET device 300F is obtained by removing the combined gate masking layer 314 by, for example, wet etching, from the finFET device 300E, and filling out a space, void by the removal of the combined gate masking layer 314, with a gate structure 315 through at least one of CVD, PECVD and ALD. The gate structure 315 may be formed of the same material forming the gate structure 215 shown in FIG. 2E, and thus, descriptions thereof are omitted herein.

As the combined gate masking layer 314 has a same horizontal width at both sides of the $1^{st}$ and $2^{nd}$ sets of the fin structures 310A and 310B, the gate structure 315 replacing the combined gate masking layer 314 also has a same horizontal width at both sides of the $1^{st}$ and $2^{nd}$ sets of the fin structures 310A and 310B, and this width may be consistent along the entire vertical length of the left-most fin structure of the $1^{st}$ sets of the fin structures 310A and the entire vertical length of the right-most fin structures of the $2^{nd}$ sets of the fin structures 310B, according to an embodiment. Further, it is understood that since the gate structure 315 replacing the combined gate masking layer 314 is defined by the combined gate masking layer 314, the gate structure 315 is also self-aligned with respect to the left-most fin structure of the $1^{st}$ set of the fin structures 310A and the right-most fin structure of the $2^{nd}$ set of the fin structures 310B.

The finFET device 300F may take a form of two finFET devices such as a CMOS device which shares the gate structure 315 as a common gate of the two finFET devices, as describe above in reference to FIG. 3D. However, according to an embodiment, this gate structure sharing between two finFET devices may be achieved in different methods as described below.

FIGS. 4A to 4D illustrate simplified cross-sectional views of another finFET device at a plurality of steps until the finFET device is defined by a common gate structure, according to embodiments.

Figure 4A:
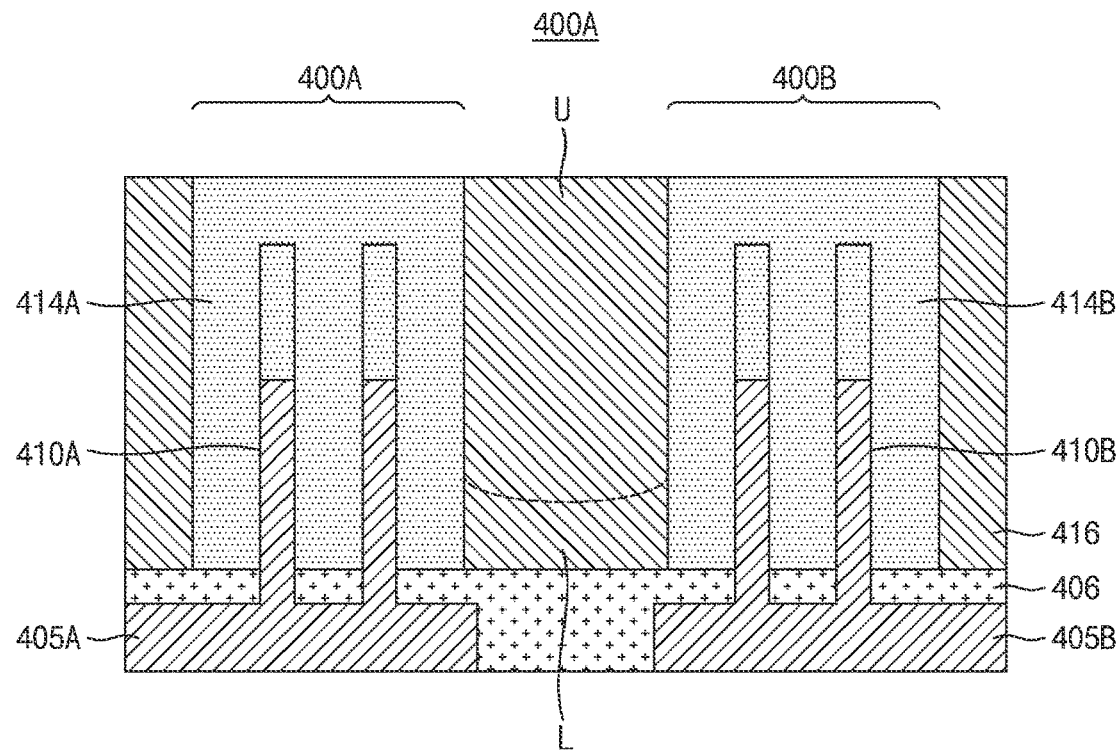
FIGS. 4A to 4D illustrate simplified cross-sectional views of another finFET device at a plurality of steps until the finFET device is defined by a common gate structure, according to embodiments.

FIG. 4A shows a couple of finFET devices isolated by a gate-cut masking layer, according to an embodiment.

Referring to FIG. 4A, $1^{st}$ and $2^{nd}$ finFET devices 400A and 400B include $1^{st}$ and $2^{nd}$ sets of fin structures 410A and 410B enclosed by $1^{st}$ and $2^{nd}$ gate masking layers 414A and 414B above $1^{st}$ and $2^{nd}$ substrates 405A and 405b, respectively, with an STI layer 406 therebetween. The $1^{st}$ and $2^{nd}$ finFET devices 400A and 400B are isolated from each other and from adjacent gate-cut masking structures by the gate-cut masking structure 416 formed therebetween and at left and right sides thereof, respectively.

Here, each of the $1^{st}$ and $2^{nd}$ finFET devices 400A and 400B may be the same as the finFET device 200D shown in FIG. 2D. Thus, each of the $1^{st}$ and $2^{nd}$ gate masking layers 414A and 414B is also self-aligned with respect to each of the $1^{st}$ and $2^{nd}$ sets of the fin structures 410A and 410B, respectively, to have a same horizontal with at both sides. Accordingly, structural descriptions about the $1^{st}$ and $2^{nd}$ finFET devices 400A and 400B and descriptions about a method of manufacturing the same are omitted herein to describe the following method of connecting the $1^{st}$ and $2^{nd}$ finFET devices 400A and 400B.

Given the two finFET devices 400A and 400B with the gate-cut masking structure 416 thereon, the $1^{st}$ and $2^{nd}$ gate masking layers may be connected first in the following step.

Figure 4B:
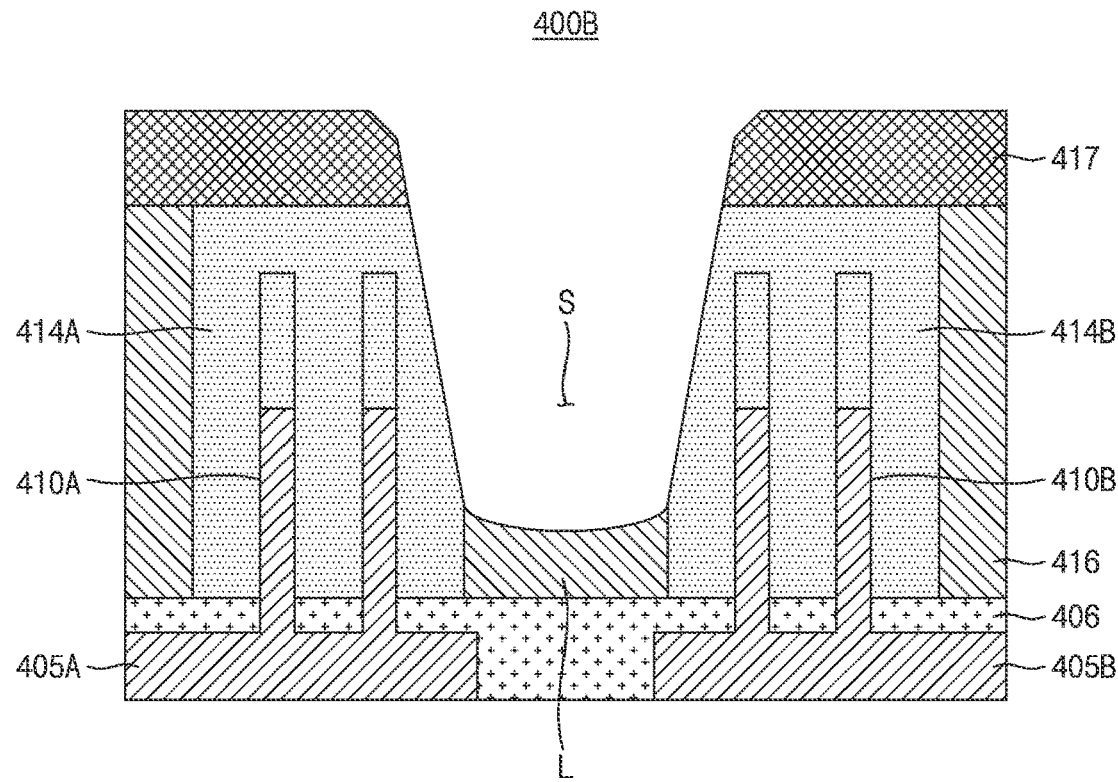

FIG. 4B shows that a two finFET devices obtained after a next manufacturing step is performed on the two finFET devices of FIG. 4A, according to an embodiment.

Referring to FIG. 4B, a hardmask layer 417 is deposited and patterned to open a top surface of the gate-cut masking structure 416 at a position between the $1^{st}$ and $2^{nd}$ finFET devices 400A and 400B. Next, the gate-cut masking structure 416 between the $1^{st}$ and $2^{nd}$ finFET devices 400A and 400B is etched down using the hardmask layer 417 through, for example, dry etching, to remove an upper portion U thereof and leave a lower portion L thereof between the $1^{st}$ and $2^{nd}$ finFET devices 400A and 400B. The lower portion L may be positioned at a level where source/drain regions are formed from the $1^{st}$ and $2^{nd}$ sets of the fin structures 410A and 410B in a later step. When the upper portion U of the gate-cut masking structure 416 between the $1^{st}$ and $2^{nd}$ finFET devices 400A and 400B is etched down, part of the $1^{st}$ gate masking layer 414A and part of the $2^{nd}$ gate masking layer 414B near the etched upper portion U of the gate-cut masking structure 416 may also be removed.

The hardmask layer 417 may be formed of at least one of a metal such as titanium nitride (TiN) and a silicon compound such as silicon oxynitride (SiON) or silicon dioxide ($SiO_2$).

Figure 4C:
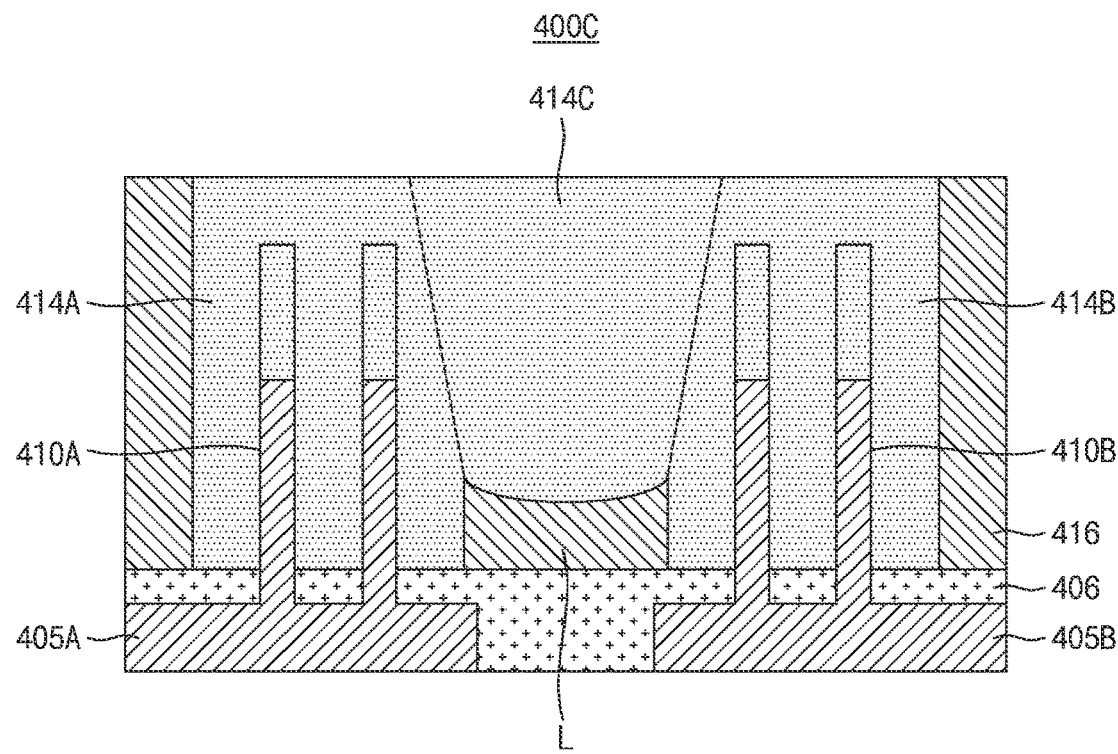

FIG. 4C shows that two finFET devices obtained after a next manufacturing step is performed on the two finFET devices of FIG. 4B, according to an embodiment.

Referring to FIG. 4C, after the gate-cut masking structure 416 is etched at its upper portion U in the previous step, a space S void by the etching in the previous step is filled out with a connection gate masking layer 414C which is formed of the same material as the gate-cut masking structure 414, and the hardmask layer 417 is removed. This connection gate masking layer 414C may form a bridge portion connecting the $1^{st}$ and $2^{nd}$ gate masking layers 414A and 414B.

The connection gate masking layer 414C may be formed through at least one of CVD, PECVD and ALD, not being limited thereto, and the hardmask layer 417 may be removed by, for example, dry etching, not being limited thereto.

As a result of the deposition of the connection gate masking layer 414C, the $1^{st}$ and $2^{nd}$ finFET devices 400A and 400B are connected through the connection gate masking layer 414C.

Figure 4D:
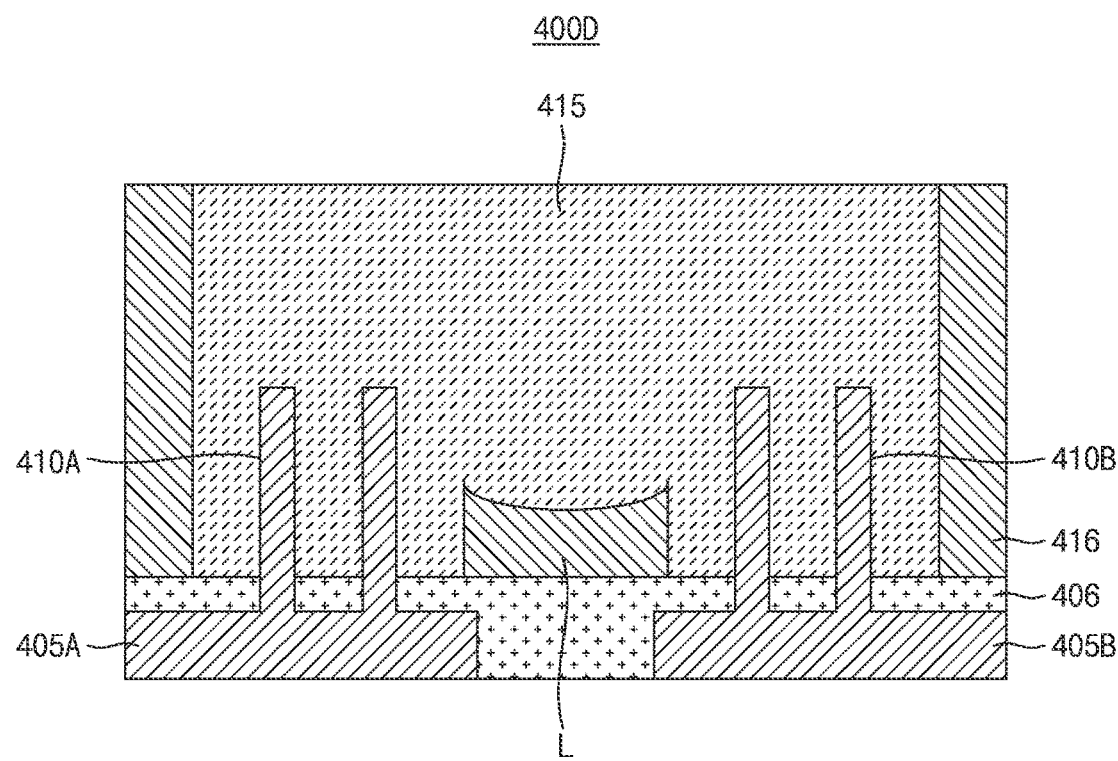

FIG. 4D shows that two finFET devices obtained after a next manufacturing step is performed on the two finFET devices of FIG. 4C, according to an embodiment.

In FIG. 4D, the $1^{st}$ and $2^{nd}$ finFET devices 400A and 400B are finished by removing the $1^{st}$ and $2^{nd}$ gate masking layers 414A and 414B as well as the connection gate masking layer 414C by, for example, wet etching, from the $1^{st}$ and $2^{nd}$ finFET devices 400A and 400B, and a space, void by the removal of the gate masking layers 414A, 414B and 414C, is filled out with a gate structure 415 through at least one of CVD, PECVD and ALD.

The gate structure 415 may be formed of the same material forming the gate structure 215 shown in FIG. 2E, and thus, descriptions thereof are omitted herein.

It is understood here that the lower portion L of the gate-cut masking structure 416 described in reference to FIG. 4B is intentionally left from the etching of the gate-cut masking structure 416 so that this lower portion L is used as an insulation structure reducing parasitic capacitance generated between the gate structure 415 and source/drain regions (not shown) formed based on the $1^{st}$ and $2^{nd}$ sets of the fin structures 410A and 410B. Thus, due to the reduced capacitance between the source/drain regions and the gate structure 415, the two finFET devices 400A and 400B may have a better transistor performance than the two finFET devices shown in FIG. 3F.

This inventive concept of reducing parasitic capacitance in finFET devices having self-aligned gate structures may also be achieved by the following method.

FIGS. 5A to 5F illustrate simplified cross-sectional views of still another finFET device at a plurality of steps until the finFET device is defined by a common gate structure, according to embodiments.

Figure 5A:
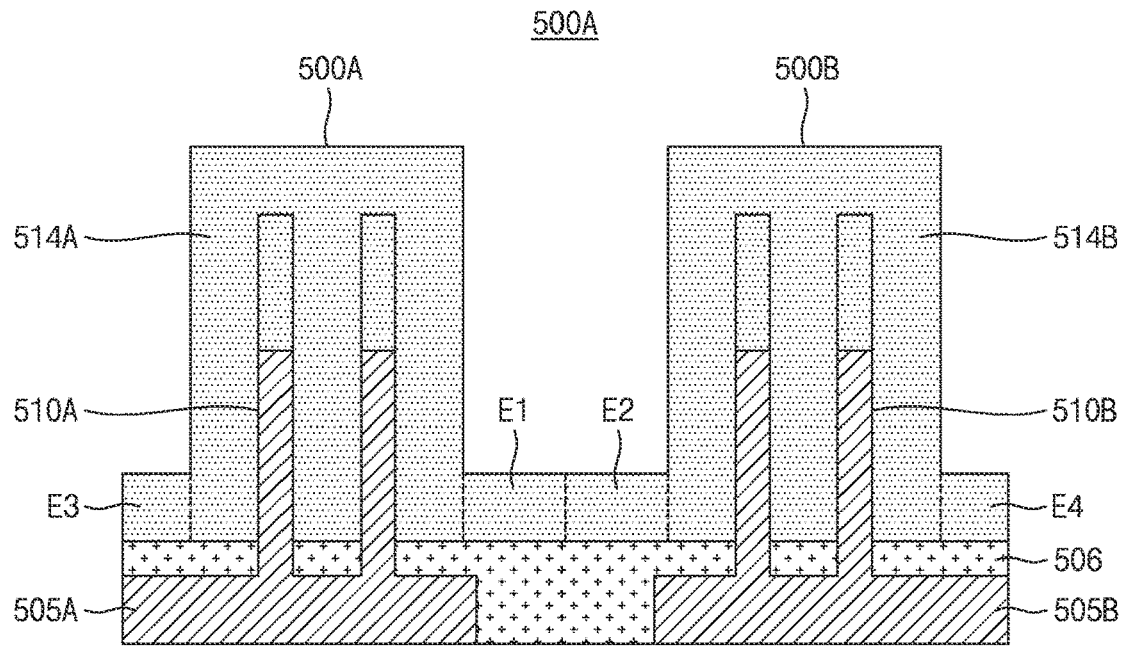
FIGS. 5A to 5F illustrate simplified cross-sectional views of still another finFET device at a plurality of steps until the finFET device is defined by a common gate structure, according to embodiments.

FIG. 5A shows a couple of finFET devices having self-aligned gate masking layers before a gate-cut masking structure is formed to isolate the finFET devices, according to an embodiment.

In FIG. 5A, $1^{st}$ and $2^{nd}$ finFET devices 500A and 500B include $1^{st}$ and $2^{nd}$ sets of fin structures 510A and 510B enclosed by $1^{st}$ and $2^{nd}$ gate masking layers 514A and 514B above $1^{st}$ and $2^{nd}$ substrates 505A and 505b, respectively, with an STI layer 506 therebetween. The $1^{st}$ and $2^{nd}$ finFET devices 500A and 500B are connected to each other through respective inner-extended portions E1 and E2 of the $1^{st}$ and $2^{nd}$ gate masking layers 514A and 514B on the STI layer 506 isolating the $1^{st}$ and $2^{nd}$ finFET devices 500A and 500B from each other. The inner-extended portions E1 and E2 along with outer-extended portions E3 and E4 are formed as the and $2^{nd}$ gate masking layers 514A and 514B are self-aligned with respect to the $1^{st}$ and $2^{nd}$ sets of the fin structures 510A and 510B. The inner-extended portions E1 and E2 are respectively extended in an inside direction from a right side surface of the $1^{st}$ gate masking layer 514A and a left side surface of the $2^{nd}$ gate masking layer 514B, and the outer-extended portions E3 and E4 are respectively extended in an outside direction on the STI layer 506 from a left side surface of the $1^{st}$ gate masking layer 514A and a right side surface of the $2^{nd}$ gate masking layer 514B.

Here, each of the $1^{st}$ and $2^{nd}$ finFET devices 500A and 500B may be the same as the finFET device 200B shown in FIG. 2B. Thus, as described above, each of the $1^{st}$ and $2^{nd}$ gate masking layers 514A and 514B is also self-aligned with respect to each of the $1^{st}$ and $2^{nd}$ sets of the fin structures 510A and 510B, respectively, to have a same horizontal with at both sides. Accordingly, structural descriptions about the $1^{st}$ and $2^{nd}$ finFET devices 500A and 500B and descriptions about a method of manufacturing the same are omitted herein to describe the following method of connecting the $1^{st}$ and $2^{nd}$ finFET devices 500A and 500B having a reduced capacitance between a gate structure and source/drain regions.

Figure 5B:
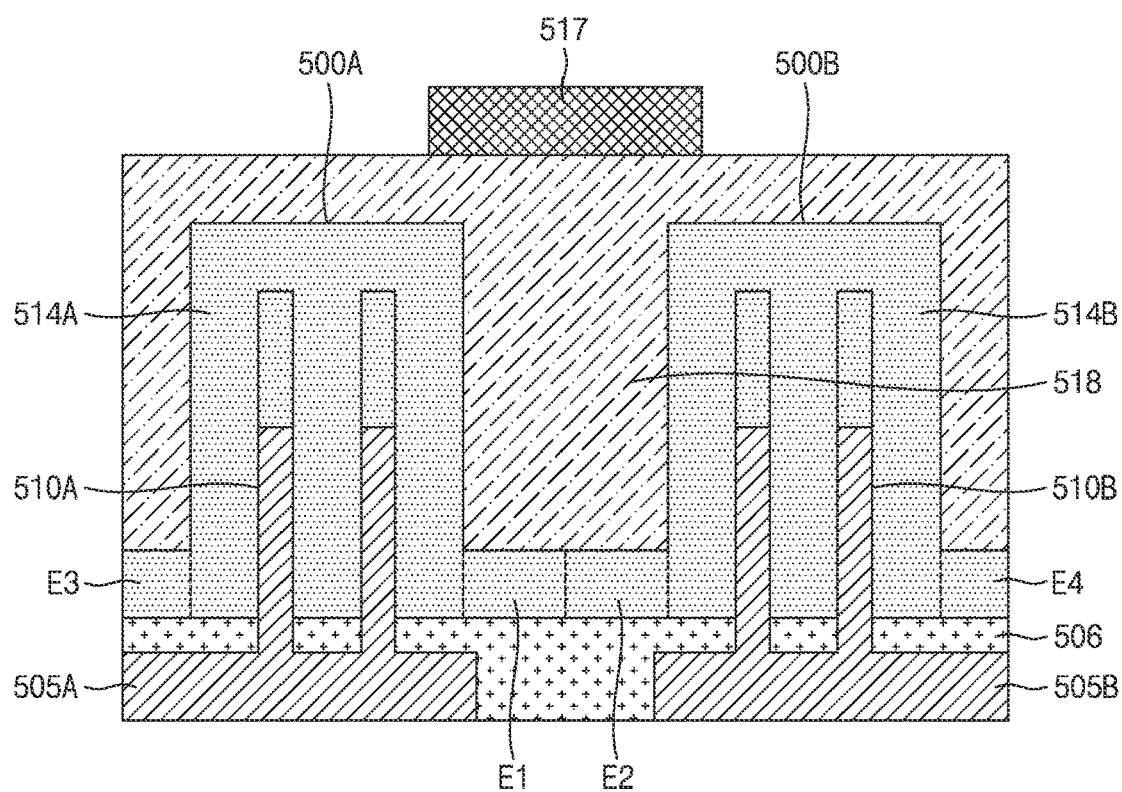

FIG. 5B shows that a two finFET devices obtained after a next manufacturing step is performed on the two finFET devices of FIG. 5A, according to an embodiment.

Referring to FIG. 5B, a passivation layer 518 is deposited above the $1^{st}$ and $2^{nd}$ gate masking layers 514A and 514B including the inner-extended potions E1 and E2 and the outer-extended portions E3 and E4 described above in reference to FIG. 5A. This passivation layer 518 may be formed at least to passivate the inner-extended portions E1 and E2 of the and $2^{nd}$ gate masking layers 514A and 514B from a later process of etching the outer-extended portions E3 and E4. This passivation layer 518 may be formed of at least one of polysilicon, silicon oxide ($SiO_x$) and silicon nitride ($Si_xN_y$) different from the material forming the $1^{st}$ and $2^{nd}$ gate masking layers 514A and 514B.

After depositing the passivation layer 518 as above, a hardmask layer 517 may be deposited and patterned on the passivation layer 518 at a position vertically above and corresponding to the inner-extended portions E1 and E2 of the $1^{st}$ and $2^{nd}$ gate masking layers 514A and 514B. The hardmask layer 517 may be formed of at least one of a metal such as TiN and a silicon compound such as SiON or $SiO_2$, not being limited thereto.

Figure 5C:
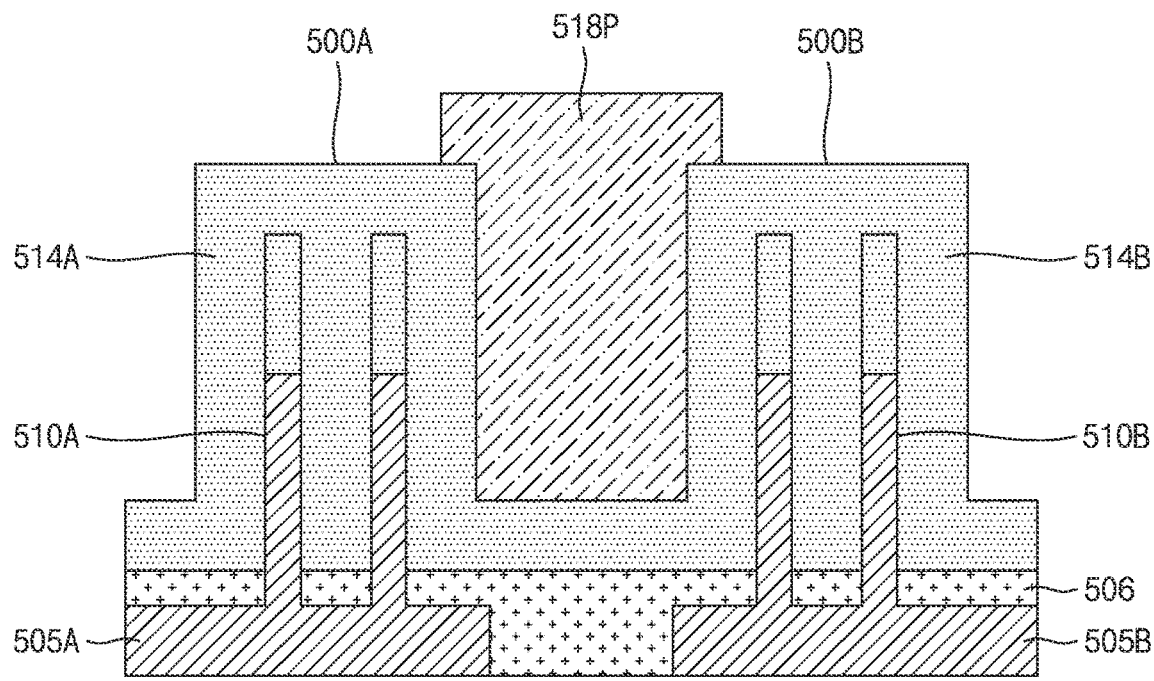

FIG. 5C shows that a two finFET devices obtained after a next manufacturing step is performed on the two finFET devices of FIG. 5B, according to an embodiment.

In FIG. 5C, the passivation layer 518 is patterned leaving a portion 518P thereof below the hardmask layer 517 so that this portion 518P of the passivation layer 518 may passivate at least the inner-extended portions E1 and E2 in a subsequent process of etching the outer-extended portions E3 and E4. After the patterning of the portion of the passivation layer 518P, the hardmask layer 517 is removed by, for example, dry etching.

Figure 5D:
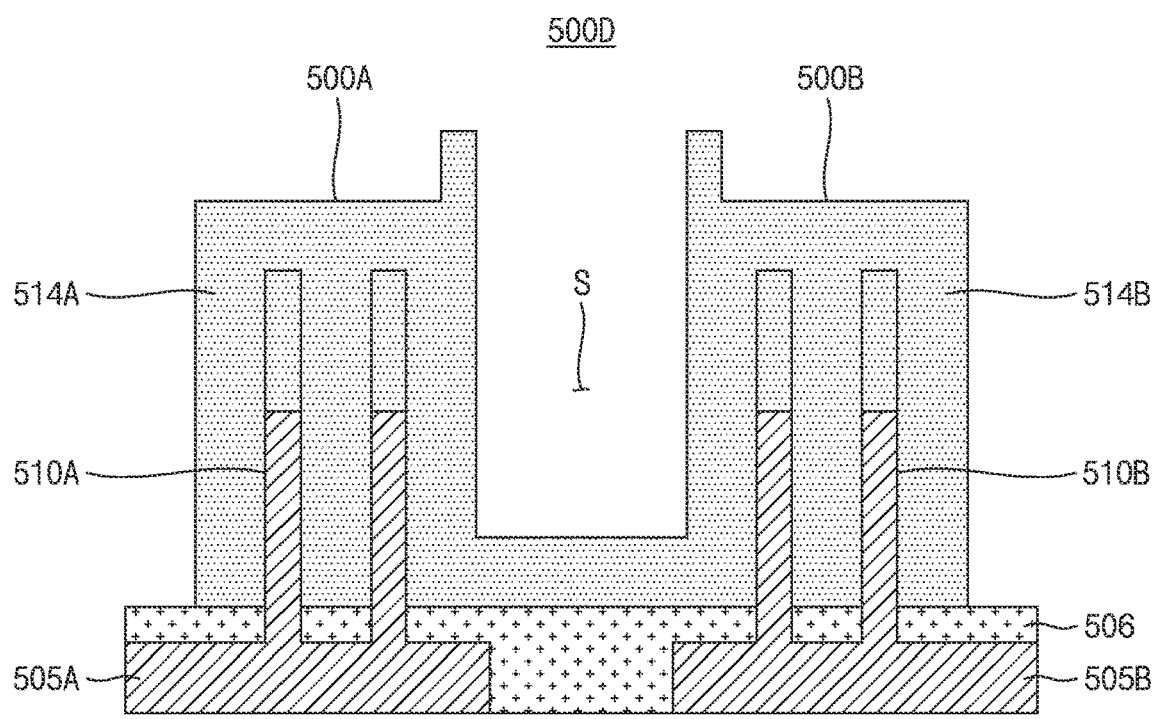

FIG. 5D shows that a two finFET devices obtained after a next manufacturing step is performed on the two finFET devices of FIG. 5C, according to an embodiment.

In FIG. 5D, the outer-extended portions E3 and E4 of the $1^{st}$ and $2^{nd}$ gate masking layers 514A and 514B are etched away, for example, by dry etching, not being limited thereto, and the portion of the passivation layer 518P is removed, for example, by at least one of dry etching and wet etching, not being limited thereto.

Figure 5E:
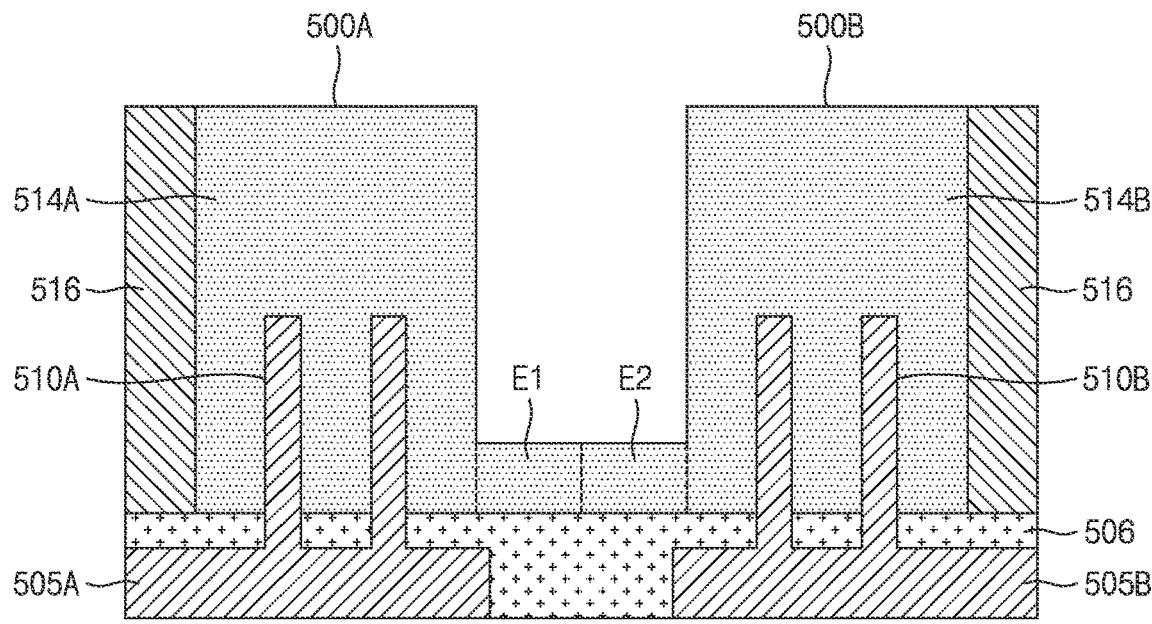

FIG. 5E shows that two finFET devices obtained after a next manufacturing step is performed on the two finFET devices of FIG. 5D, according to an embodiment.

In FIG. 5E, a gate-cut masking structure 516 is deposited at a left side of the $1^{st}$ gate masking layer 514A on the STI layer 506 exposed by the removal of the outer-extended portion E3 and a right side of the $2^{nd}$ gate masking layer 514B on the STI layer 506 exposed by the removal of the outer-extended portion E4. This gate-cut masking structure 516 is formed to isolate the $1^{st}$ and $2^{nd}$ gate masking layer 514A and 514B from one or more of adjacent gate masking layers in adjacent cells. The gate-cut masking structure 516 may be formed of the same material forming the gate-cut masking structure 216 of FIG. 2D, and thus, descriptions thereof are omitted herein.

Figure 5F:
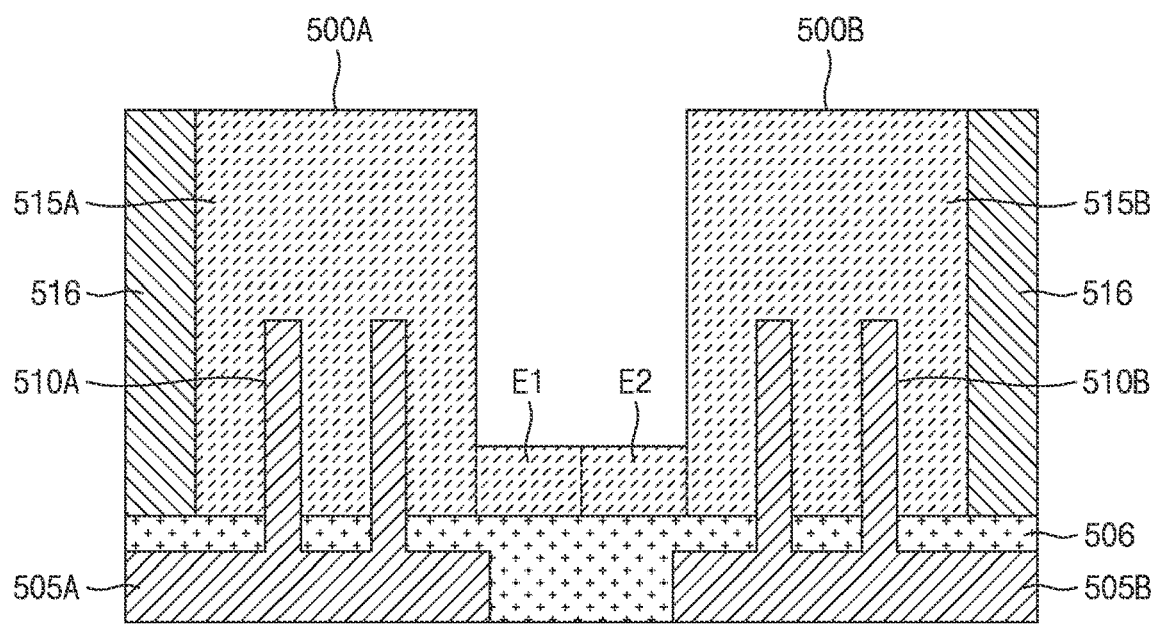

FIG. 5F shows that two finFET devices obtained after a next manufacturing step is performed on the two finFET devices of FIG. 5E, according to an embodiment.

In FIG. 5F, the two finFET device 500A and 500B are finished by removing the $1^{st}$ and $2^{nd}$ gate masking layer 514A and 514B by, for example, wet etching, from the two finFET devices 500A and 500B in the previous step, and filling out a space, void by the removal of the $1^{st}$ and $2^{nd}$ gate masking layers 514A and 514B, with $1^{st}$ and $2^{nd}$ gate structure 515A and 515B, respectively, through at least one of CVD, PECVD and ALD. The $1^{st}$ and $2^{nd}$ gate structures 515A and 515B may be formed of the same material forming the gate structure 215 shown in FIG. 2E, and thus, descriptions thereof are omitted herein.

It is understood here that, as the portion 518P of the passivation layer 518 is removed as shown in FIG. 5D, a space S formed there may be used as an insulation space reducing parasitic capacitance generated between the gate structure 515A or 515B and source/drain regions (not shown) formed from the $1^{st}$ and $2^{nd}$ sets of the fin structures 510A and 510B. Thus, due to the reduced parasitic capacitance, the two finFET devices 500A and 500B may also have a better transistor performance than the two finFET devices shown in FIG. 3F.

Thus far, semiconductor devices having a self-aligned gate masking layer and a subsequent self-aligned gate structure with or without reduced capacitance between the self-aligned gate structure and source/drain regions have been described taking examples of single-stack finFET devices. However, the inventive concept is not limited thereto. The above-described embodiments may also apply to single-stack MBCFET devices, multi-stack finFET devices, multi-stack MBCFET devices, and hybrid multi-stack finFET/MBCFET devices as described below.

Figure 6:
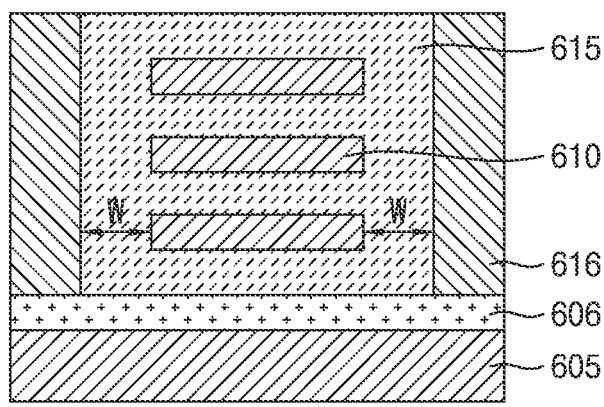
FIG. 6 illustrates a simplified cross-sectional view of an MBCFET device, which is also referred to as a nanosheet device, with a self-aligned gate structure, according to an embodiment.

FIG. 6 illustrates a simplified cross-sectional view of an MBCFET device, which is also referred to as a nanosheet device, with a self-aligned gate structure, according to an embodiment.

Referring to FIG. 6, an MBCFET device 600 includes a substrate 605, an isolation layer 606 on the substrate 605, a plurality of nanosheet layers 610 enclosed by a gate structure 615, and a gate-cut masking structure 616 formed on both sides of the gate structure 615. The nanosheet layers 610 function as a multi-bridge channel of the MBCFET device 600.

According to an embodiment, the gate structure 615 is self-aligned with respect to the nanosheet layers 610, and thus, the gate structure 615 has a same width W at both sides of the nanosheet channel layers 610 similar to the gate structure 215 of the finFET device 200E shown in FIG. 2E.

The self-alignment of the gate structure 615 is initially implemented during a manufacturing process (not shown) of the MBCFET device 600, in which a dummy gate structure (not shown) is first deposited on and self-aligned with respect to a nanosheet structure including the nanosheet layers 610 and a plurality of sacrificial layers (not shown) alternatingly layered below, in-between and above the nanosheet layers 610 and a hardmask layer (not shown) formed on the nanosheet structure, and then, outer-extended portions of the dummy gate structure on the isolation layer extended in an outside direction from side surfaces of the dummy gate structure are etched away, the gate-cut masking structure 616 is formed at both sides of the dummy gate structure, and the hardmask layer, the dummy gate structure and the sacrificial layers are replaced by the gate structure 615. Here, it is understood that, since the dummy gate structure replaced by and defining the gate structure 615 is self-aligned with respect to the nanosheet structure including the nanosheet layers 610, the gate structure 615 is self-aligned with respect to the nanosheet layers 610.

Through the foregoing process, the MBCFET device 600 may have a self-aligned gate structure 615 as shown in FIG. 6.

Figure 7:
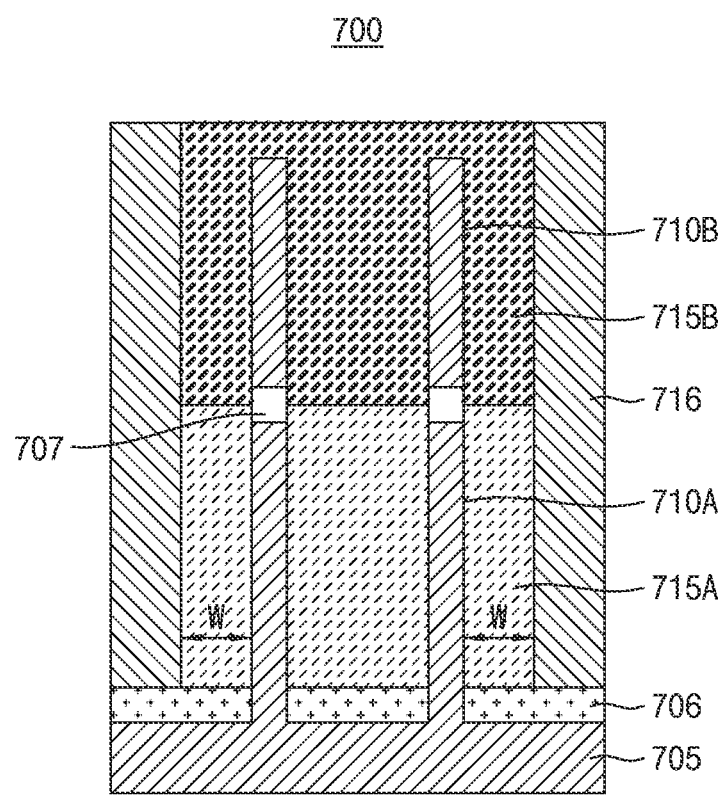
FIG. 7 illustrates a simplified cross-sectional view of a multi-stack finFET device with a self-aligned gate structure, according to an embodiment.

FIG. 7 illustrates a simplified cross-sectional view of a multi-stack finFET device with a self-aligned gate structure, according to an embodiment.

Referring to FIG. 7, a multi-stack finFET device 700 includes a substrate 705, an STI layer 706 on the substrate 705, a $1^{st}$ fin structures 710A enclosed by a $1^{st}$ gate structure 715A, a $2^{nd}$ fin structures 710B stacked on the $1^{st}$ fin structures 710A with an isolation layer 708 therebetween and enclosed by a $2^{nd}$ gate structure 715B stacked on the $1^{st}$ gate structure 715A, and a gate-cut masking structure 716 formed on both sides of the $1^{st}$ and $2^{nd}$ gate structures 715A and 715B. According to an embodiment, the $1^{st}$ and $2^{nd}$ gate structures 715A and 715B are self-aligned with respect to the $1^{st}$ and $2^{nd}$ fin structures 710A and 710B, and thus, the $1^{st}$ and $2^{nd}$ gate structures 715A and 715B have a same width W at both sides of the $1^{st}$ and $2^{nd}$ fin structures 710A and 710B.

The self-alignment of the $1^{st}$ and $2^{nd}$ gate structures 715A and 715B are initially implemented during a manufacturing process (not shown) of the multi-stack finFET device 700, in which $1^{st}$ and $2^{nd}$ gate masking layers (not shown) are first deposited on and self-aligned with respect to a multi-stack of the $1^{st}$ and $2^{nd}$ fin structures 710A and 710B with the isolation layer 708 therebetween and a hardmask layer (not shown) thereon, and then, outer-extended portions of the $1^{st}$ gate masking layer on the STI layer 706 extended in an outside direction from side surfaces of the $1^{st}$ gate masking layer are etched away, the gate-cut masking structure 716 is formed at both sides of the $1^{st}$ and $2^{nd}$ gate masking layers, and the hardmask layer and the $1^{st}$ and $2^{nd}$ gate masking layers are replaced with the $1^{st}$ and $2^{nd}$ gate structures 715A and 715B. Here, it is understood that, since the $1^{st}$ and $2^{nd}$ gate masking layer replaced by and defining the $1^{st}$ and $2^{nd}$ gate structures 715A and 715B are self-aligned with respect to the $1^{st}$ and $2^{nd}$ fin structures 710A and 710B, respectively, the $1^{st}$ and $2^{nd}$ gate structures 715A and 715B are also self-aligned with respect to the $1^{st}$ and $2^{nd}$ fin structures 710A and 710B, respectively.

Through the foregoing process, the multi-stack finFET device 700 may have the self-aligned $1^{st}$ and $2^{nd}$ gate structures 715A and 715B as shown in FIG. 7

Figure 8:
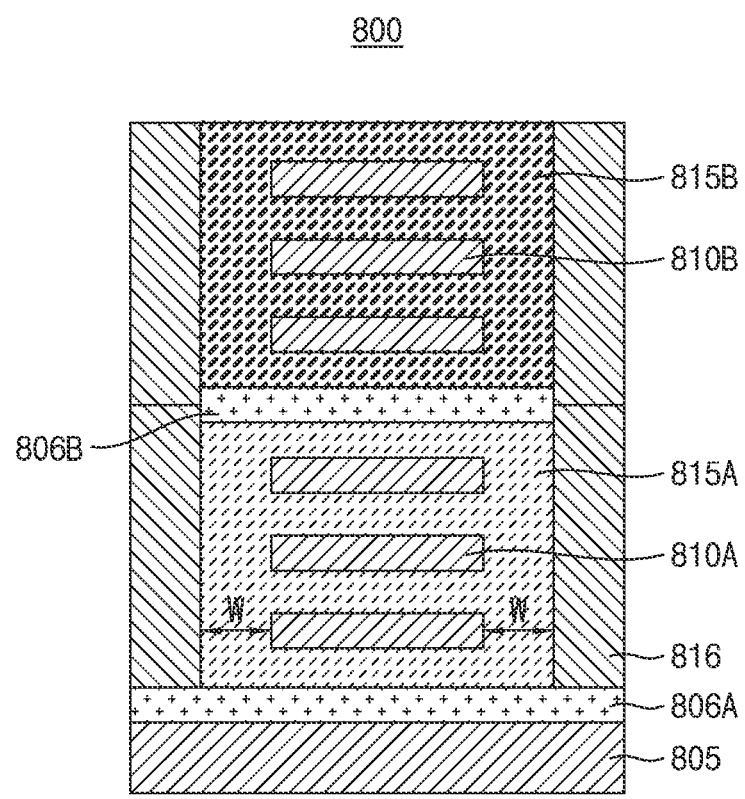
FIG. 8 illustrates a simplified cross-sectional view of a multi-stack MBCFET device, which is also referred to as a multi-stack nanosheet device, with a self-aligned gate structure, according to an embodiment.

FIG. 8 illustrates a simplified cross-sectional view of a multi-stack MBCFET device, which is also referred to as a multi-stack nanosheet device, with a self-aligned gate structure, according to an embodiment.

Referring to FIG. 8, a multi-stack MBCFET device 800 includes a substrate 805, a $1^{st}$ isolation layer 806A on the substrate 805, a plurality of $1^{st}$ nanosheet layers 810A enclosed by a $1^{st}$ gate structure 815A, a plurality of $2^{nd}$ nanosheet layers 810B enclosed by a $2^{nd}$ gate structure 815B with a $2^{nd}$ isolation layer 806B therebetween and stacked on the $1^{st}$ nanosheet layers 810A, and a gate-cut masking structure 816 formed on both sides of the $1^{st}$ and $2^{nd}$ gate structures 815A and 815B. The nanosheet layers 810A and 810B function as multi-bridge channels of the MBCFET device 800.

According to an embodiment, the 1$^{st}$ and 2$^{nd}$ gate structures 815A and 815B are self-aligned with respect to the 1$^{st}$ and 2$^{nd}$ nanosheet layers 810A and 810B, and thus, the 1$^{st}$ and 2$^{nd}$ gate structures 815A and 815B have a same width W at both sides of the 1$^{st}$ and 2$^{nd}$ nanosheet layers 810A and 810B similar to the gate structure 615 of the MBCFET device 600 shown in FIG. 6.

The self-alignment of the 1$^{st}$ and 2$^{nd}$ gate structures 815A and 815B is initially implemented during a manufacturing process (not shown) of the multi-stack MBCFET device 800, in which 1$^{st}$ and 2$^{nd}$ dummy gate structures (not shown) are first deposited on and self-aligned with respect to a multi-stack nanosheet structure including the 1$^{st}$ and 2$^{nd}$ nanosheet channel layers 810A and 810B and a plurality of 1$^{st}$ and 2$^{nd}$ sacrificial layers (not shown) alternatingly layered below, in-between and above the 1$^{st}$ and 2$^{nd}$ nanosheet channel layers 810A and 810B, respectively, and a hardmask layer (not shown) formed on the multi-stack nanosheet structure, and then, outer-extended portions of the 1$^{st}$ dummy gate structure on the 1$^{st}$ isolation layer 806A extended in an outside direction from side surfaces of the 1$^{st}$ and dummy gate structure are etched away, the gate-cut masking structure 816 is formed at both sides of the 1$^{st}$ and 2$^{nd}$ dummy gate structures, and the hardmask layer, the 1$^{st}$ and 2$^{nd}$ dummy gate structures and the 1$^{st}$ and 2$^{nd}$ sacrificial layers are replaced with the 1$^{st}$ and 2$^{nd}$ gate structures 815A and 815B. Here, it is understood that, since the 1$^{st}$ and 2$^{nd}$ dummy gate structures replaced by and defining the 1$^{st}$ and 2$^{nd}$ gate structures 815A and 815B are self-aligned with respect to the multi-stack nanosheet structure including the 1$^{st}$ and 2$^{nd}$ nanosheet layers 810A and 810B, the 1$^{st}$ and 2$^{nd}$ gate structure 815A and 815B are self-aligned with respect to the 1$^{st}$ and 2$^{nd}$ nanosheet layers 810A and 810B.

Through the foregoing process, the multi-stack MBCFET device 800 may have the self-aligned gate structures 815A and 815B as shown in FIG. 8.

In the above embodiments described in reference to FIGS. 6 to 8, descriptions about materials of each element of the corresponding semiconductor devices and methods of deposition and etching used for manufacturing the semiconductor devices are omitted because they use the same materials and the same deposition and etching methods described in the previous embodiments in reference to FIGS. 2A to 5F.

Figure 9:
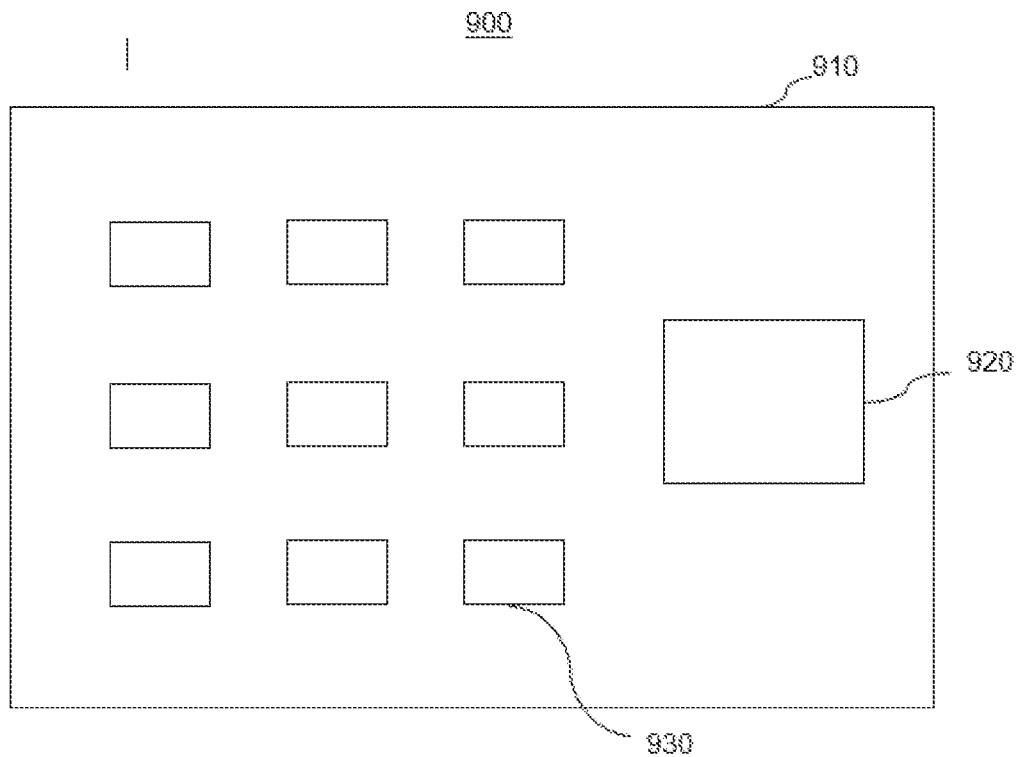
FIG. 9 illustrates a schematic plan view of a semiconductor module according to an embodiment.

FIG. 9 illustrates a schematic plan view of a semiconductor module according to an embodiment.

Referring to FIG. 9, a semiconductor module 900 according to an embodiment may include a processor 920 and semiconductor devices 930 that are mounted on a module substrate 910. The processor 920 and/or the semiconductor devices 930 may include one or more semiconductor devices described in the above embodiments.

Figure 10:
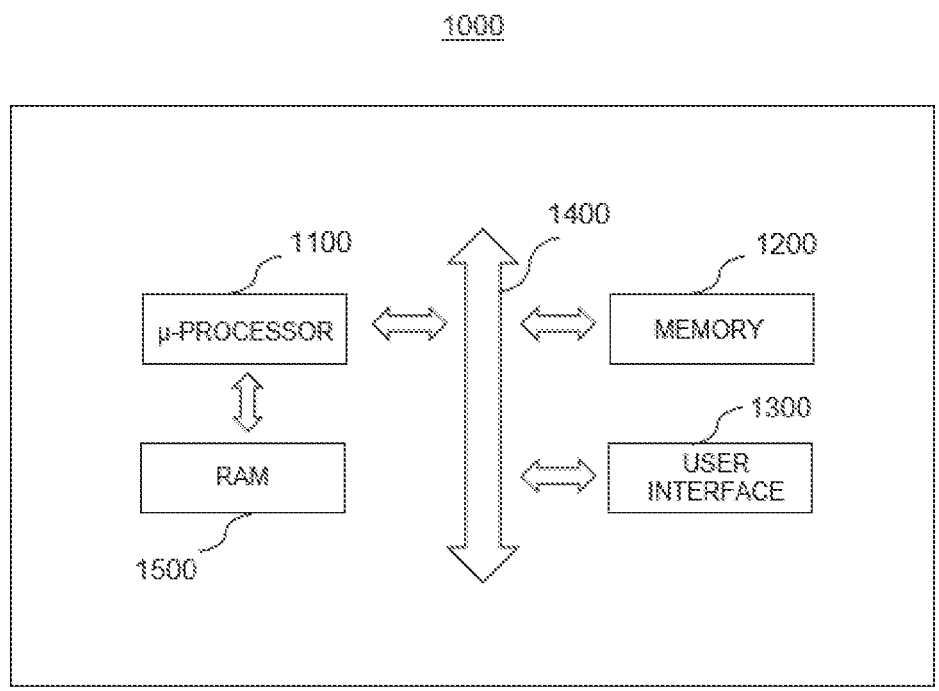
FIG. 10 illustrates a schematic block diagram of an electronic system according to an embodiment.

FIG. 10 illustrates a schematic block diagram of an electronic system according to an embodiment.

Referring to FIG. 10, an electronic system 1000 in accordance with an embodiment may include a microprocessor 1100, a memory 1200, and a user interface 1300 that perform data communication using a bus 1400. The microprocessor 1100 may include a central processing unit (CPU) or an application processor (AP). The electronic system 1000 may further include a random access memory (RAM) 1500 in direct communication with the microprocessor 1100. The microprocessor 1100 and/or the RAM 1500 may be implemented in a single module or package. The user interface 1300 may be used to input data to the electronic system 1000, or output data from the electronic system 1000. For example, the user interface 1300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 1200 may store operational codes of the microprocessor 1100, data processed by the microprocessor 1100, or data received from an external device. The memory 1200 may include a memory controller, a hard disk, or a solid state drive (SSD).

At least the microprocessor 1100, the memory 1200 and/or the RAM 1500 in the electronic system 1000 may include one or more semiconductor devices described in the above embodiments.

Due to the above-described self-aligned gate structures, an array of semiconductor devices may all have gate structures with a consistent dimension overcoming misalignment deficiencies that may occur during photolithography masking and gate-cutting steps in the process of manufacturing the array of the semiconductor devices.

The foregoing is illustrative of exemplary embodiments and is not to be construed as limiting thereof. For example, one or more steps described above for manufacturing a supervia may be omitted to simplify the process. Although a few exemplary embodiments have been described, those skilled in the art will readily appreciate that many modifications are possible in the above embodiments without materially departing from the inventive concept.

What is claimed is:

1. A semiconductor device comprising:
   at least one substrate;
   1$^{st}$ at least one channel structure and 2$^{nd}$ at least one channel structure at a side of the 1$^{st}$ at least one channel structure, on the at least one substrate; and
   at least one gate structure comprising a 1$^{st}$ portion surrounding at least top and side surfaces of the 1$^{st}$ at least one channel structure, a 2$^{nd}$ portion surrounding at least top and side surfaces of the 2$^{nd}$ at least one channel structure, and a bridge portion between the 1$^{st}$ and 2$^{nd}$ portions,
   wherein the bridge portion is vertically thinner than each of the 1$^{st}$ and 2$^{nd}$ portions,
   wherein a left horizontal distance between a left side surface of the 1$^{st}$ at least one channel structure and a left side surface of the at least one gate structure is equal to a right horizontal distance between a right side surface of the 2$^{nd}$ at least one channel structure and a right side surface of the at least one gate structure, and
   wherein each of the left and right side surfaces of the at least one gate structure is substantially planar through an entire vertical length of the at least one gate structure.

2. The semiconductor device of claim 1, wherein a bottom surface of the bridge portion is higher than a bottom surface of each of the 1$^{st}$ and 2$^{nd}$ portions.

3. The semiconductor device of claim 1, wherein
   the at least one substrate comprises 1$^{st}$ and 2$^{nd}$ substrates, are isolated from each other, below the 1$^{st}$ and 2$^{nd}$ at least one channel structures, respectively.

4. The semiconductor device of claim 3, wherein the 1$^{st}$ at least one channel structure further comprises a 2$^{nd}$ set of fin structures, vertically stacked above the 1st set of the fin structures, to form a 2$^{nd}$ finFET, and
   wherein the at least one gate structure comprises 1$^{st}$ and 2$^{nd}$ gate structures surrounding top and side surfaces of the 1$^{st}$ and 2$^{nd}$ fin structures, respectively.

5. The semiconductor device of claim 1, wherein the 1$^{st}$ and 2$^{nd}$ at least one channel structures comprise 1$^{st}$ and 2$^{nd}$ sets of fin structures, respectively, disposed side by side to form $1^{st}$ and $2^{nd}$ fin field-effect transistors (finFETs), respectively, and wherein a left horizontal distance between a left side surface of a left-most fin structure among the $1^{st}$ set of the fin structures and the left side surface of the at least one gate structure is equal to a right horizontal distance between a right side of a right-most fin structure among the $2^{nd}$ set of the fin structures and the right side surface of the at least one gate structure.

6. The semiconductor device of claim 5, wherein a bottom surface of the bridge portion is higher than a bottom surface of each of the $1^{st}$ and $2^{nd}$ portions.

7. The semiconductor device of claim 6, wherein the semiconductor device further comprises an insulation structure between the $1^{st}$ and $2^{nd}$ portions and below the bridge portion of the at least one gate structure at a level of source/drain regions to be formed from the $1^{st}$ and $2^{nd}$ sets of the fin structures.

8. The semiconductor device of claim 1, wherein a top surface of the bridge portion of the gate structure is lower than a top surface of each of the $1^{st}$ and $2^{nd}$ portions of the at least one gate structure.

9. The semiconductor device of claim 1, wherein the $1^{st}$ and $2^{nd}$ at least one channel structures comprise $1^{st}$ and $2^{nd}$ nanosheet structures comprising a plurality of $1^{st}$ and $2^{nd}$ nanosheet layers above the at least one substrate to form $1^{st}$ and $2^{nd}$ multi-bridge channel field-effect transistors (MBCFETs), respectively, and wherein a left horizontal distance between a left side surface of a nanosheet layer among the $1^{st}$ nanosheet layers and a left side surface of the at least one gate structure is equal to a right horizontal distance between a right side of a nanosheet layer among the $2^{nd}$ nanosheet layers and a right side surface of the at least one gate structure.

10. The semiconductor device of claim 9, wherein the $1^{st}$ at least one channel structure further comprises a $3^{rd}$ nanosheet structure, vertically stacked above the $1^{st}$ nanosheet structure and comprising a plurality of $3^{rd}$ nanosheet layers, to form a $3^{rd}$ MBCFET, and wherein the at least one gate structure comprises $1^{st}$ and $2^{nd}$ gate structures surrounding the $1^{st}$ and $3^{rd}$ nanosheet structures, respectively.

11. A semiconductor device array comprising a plurality of vertically-stacked semiconductor devices, wherein each of the semiconductor devices comprises:
at least one substrate;
at least one channel structure formed on the at least one substrate; and
at least one gate structure surrounding at least top and side surfaces of the at least one channel structure,
wherein the at least one gate structure has an equal horizontal width at both sides of the at least one channel structure in a channel width direction, and
wherein side surfaces of the at least one gate structures of the plurality of vertically-stacked semiconductor devices are vertically coplanar.

12. A method of manufacturing a semiconductor device, the method comprising:
providing $1^{st}$ at least one channel structure and $2^{nd}$ at least one channel structure at a side of the $1^{st}$ at least one channel structure, above $1^{st}$ and $2^{nd}$ substrates isolated from each other, respectively;
depositing at least one gate masking layer on the $1^{st}$ and $2^{nd}$ at least one channel structures so that the at least one gate masking layer is formed on at least top and side surfaces of each of the $1^{st}$ and $2^{nd}$ at least one channel structures and spread outward above the $1^{st}$ and $2^{nd}$ substrates to form outer-extended portions of the at least one gate masking layer, before a gate-cut process is performed, wherein the at least one gate masking layer is self-aligned with respect to the $1^{st}$ and $2^{nd}$ at least one channel structures by the depositing; and
removing the outer-extended portions of the at least one gate masking layer so that the at least one gate masking layer at a left side of the $1^{st}$ at least one channel structure and at a right side of the $2^{nd}$ at least one channel structure have an equal width.

13. The method of claim 12, wherein, after the outer-extended portions of the at least one gate masking layer are removed, the at least one gate masking layer at the left side of the $1^{st}$ at least one channel structure and the right side of the $2^{nd}$ at least one channel structure has the equal width along an entire vertical length of the $1^{st}$ and $2^{nd}$ at least one channel structures, respectively.

14. The method of claim 13, further comprising, after the outer-extended portions of the at least one gate masking layer are removed, depositing a gate-cut masking structure on both sides of the at least one gate masking layer.

15. The method of claim 14, further comprising, after the depositing the gate-cut masking structure, replacing the at least one gate masking layer with at least one gate structure.

16. The method of claim 15, wherein the at least one gate structure comprises a $1^{st}$ portion surrounding at least top and side surfaces of the $1^{st}$ at least one channel structure, a $2^{nd}$ portion surrounding at least top and side surfaces of the $2^{nd}$ at least one channel structure, and a bridge portion between the $1^{st}$ and $2^{nd}$ portions,
wherein the bridge portion is formed to be thinner than each of the $1^{st}$ and $2^{nd}$ portions, and
wherein each of left and right side surfaces of the at least one gate structure is formed to be substantially planar through an entire vertical length of the at least one gate structure.

17. The method of claim 15, wherein the at least one channel structure comprises $1^{st}$ and $2^{nd}$ sets of fin structures disposed side by side to form $1^{st}$ and $2^{nd}$ fin field-effect transistors (finFETs), respectively, and
wherein the at least one gate masking layer is self-aligned with respect to the $1^{st}$ and $2^{nd}$ sets of the fin structures such that a left horizontal distance between a left side surface of a left-most fin structure among the $1^{st}$ set of the fin structures and a left side surface of the at least one gate masking layer is equal to a right horizontal distance between a right side of a right-most fin structure among the $2^{nd}$ set of the fin structures and a right side surface of the at least one gate masking layer.

18. The method of claim 17, wherein the depositing the at least one gate masking layer comprises:
depositing a $1^{st}$ gate masking layer on a right-most fin structure among the $1^{st}$ set of the fin structures and a left-most fin structure among the $2^{nd}$ set of the fin structures so that the $1^{st}$ gate masking layer covers top and side surfaces of the right-most and left-most fin structures among the $1^{st}$ and $2^{nd}$ sets of the fin structures, respectively; and
depositing a $2^{nd}$ gate masking layer on the $1^{st}$ and $2^{nd}$ sets of the fin structures and the $1^{st}$ gate masking layer such that the $2^{nd}$ gate masking layer is formed on top and side surfaces of a left-most fin structure among the $1^{st}$ sets of the fin structures and a right-most fin structure among the $2^{nd}$ sets of the fin structures to fill out a space between the fin structures of the $1^{st}$ and $2^{nd}$ sets of the fin structures, and spread outward above the $1^{st}$ and $2^{nd}$ substrates to form the outer-extended portions of the $1^{st}$ and $2^{nd}$ gate masking layers,
wherein in the depositing the $2^{nd}$ gate masking layer, the $2^{nd}$ gate masking layer is self-aligned with respect to the left-most fin structure among the $1^{st}$ sets of the fin structures and the right-most fin structure among the $2^{nd}$ sets of the fin structures.

19. The method of claim 14, wherein the $1^{st}$ and $2^{nd}$ at least one channel structures comprise $1^{st}$ and $2^{nd}$ sets of fin structures to form $1^{st}$ and $2^{nd}$ fin field-effect transistors (finFETs), respectively,
wherein after the depositing the at least one gate masking layer, a space between the fin structures of the $1^{st}$ and $2^{nd}$ sets of the fin structures is filled out with the at least one gate masking layer, and
wherein the method further comprises:
removing the gate-cut masking structure between the $1^{st}$ and $2^{nd}$ sets of the fin structures leaving a lower portion of the gate-cut masking structure between the $1^{st}$ and $2^{nd}$ sets of the fin structures; and
forming an additional gate masking layer in a space formed by the removing the gate-cut masking structure to connect $1^{st}$ and $2^{nd}$ portions of the at least one gate masking layer respectively formed on top and side surfaces of the $1^{st}$ and $2^{nd}$ sets of the fin structures.

20. The method of claim 14, wherein the $1^{st}$ at least one channel structure comprises $1^{st}$ nanosheet structure to form a $1^{st}$ multi-bridge channel field-effect transistor (MBCFET) and a $2^{nd}$ nanosheet structure stacked above the $1^{st}$ nanosheet structure to form a $2^{nd}$ MBCFET.

* * * * *